US012431362B2

(12) United States Patent
Lin

(10) Patent No.: US 12,431,362 B2
(45) Date of Patent: Sep. 30, 2025

(54) METHOD FOR ETCHING HIGH ASPECT RATIO FEATURES WITHIN A DIELECTRIC USING A HARD MASK STACK HAVING MULTIPLE HARD MASK LAYERS

(71) Applicant: Tokyo Electron Limited, Tokyo (JP)

(72) Inventor: JinYing Lin, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 725 days.

(21) Appl. No.: 17/738,127

(22) Filed: May 6, 2022

(65) Prior Publication Data

US 2023/0360925 A1 Nov. 9, 2023

(51) Int. Cl.
*H01L 21/31* (2006.01)
*H01L 21/311* (2006.01)
*H01L 21/3213* (2006.01)

(52) U.S. Cl.
CPC .. *H01L 21/31144* (2013.01); *H01L 21/31122* (2013.01); *H01L 21/32137* (2013.01); *H01L 21/32139* (2013.01)

(58) Field of Classification Search
CPC ......... H01L 21/31122; H01L 21/31144; H01L 21/32137; H01L 21/32139; H01L 21/00; H01L 21/02; H01L 21/02107; H01L 21/02112; H01L 21/02118
USPC ........................................................ 438/584
See application file for complete search history.

(56) References Cited

U.S. PATENT DOCUMENTS

| 6,165,695 | A | 12/2000 | Yang et al. |
|---|---|---|---|
| 6,806,203 | B2 | 10/2004 | Weidman et al. |
| 6,967,072 | B2 | 11/2005 | Latchford et al. |
| 7,064,078 | B2 | 6/2006 | Liu et al. |
| 7,446,049 | B2 | 11/2008 | Kim et al. |
| 7,651,951 | B2 | 1/2010 | Tran et al. |
| 7,718,081 | B2 | 5/2010 | Liu et al. |
| 8,119,535 | B2 | 2/2012 | Tran et al. |
| 2006/0262511 | A1 | 11/2006 | Abatchev et al. |

(Continued)

OTHER PUBLICATIONS

Negishi et al., "Bottom Profile Degradation Mechanism in High Aspect Ratio Feature Etching Based on Pattern Transfer Observation", J. Vac. Sci. Technology, B35, 2017, 10 pgs.

(Continued)

*Primary Examiner* — Monica D Harrison
(74) *Attorney, Agent, or Firm* — Egan, Enders & Huston LLP.

(57) ABSTRACT

Various embodiments of stacked structures, process steps and methods are provided herein for etching high aspect ratio features (e.g., contact holes, vias, trenches, etc.) within one or more underlying layers of a stacked structure to reduce or eliminate problems that occur during conventional high aspect ratio (HAR) etch processes (such as, e.g., bowing, twisting, distortion and wiggling of HAR features etched within the underlying layers). According to one embodiment, a stacked structure in accordance with the present disclosure may include a hard mask (HM) stack formed above and in contact with one or more underlying layers formed on a semiconductor substrate. The HM stack may include at least one silicon-containing hard mask layer formed above a carbon-containing hard mask layer, and may be utilized during one or more etch processes as a combined hard mask for etching HAR features within the one or more underlying layers.

22 Claims, 10 Drawing Sheets

(56) References Cited

U.S. PATENT DOCUMENTS

2021/0098260 A1    4/2021  Yoon et al.
2022/0375759 A1*   11/2022 Kim ................. H01J 37/32834

OTHER PUBLICATIONS

Meng et al., "Cost-Effective Amorphous Silicon Hard Mask Patterning Sub-45NM Contact Trench", Institution of Microelectronics, IEEE, 2014, 3 pgs.
Humbird et al., "Fluorocarbon Plasma Etching of Silicon: Factors Controlling Etch Rate", Journal of Applied Physics 96, 2004, 7 pgs.
Miyake, "Effects of Mask and Necking Deformation on Bowing and Twisting in High-Aspect-Ratio Contact Hole Etching", Jpn. J. Appl. Phys. 48, 2009, 6 pgs.

* cited by examiner

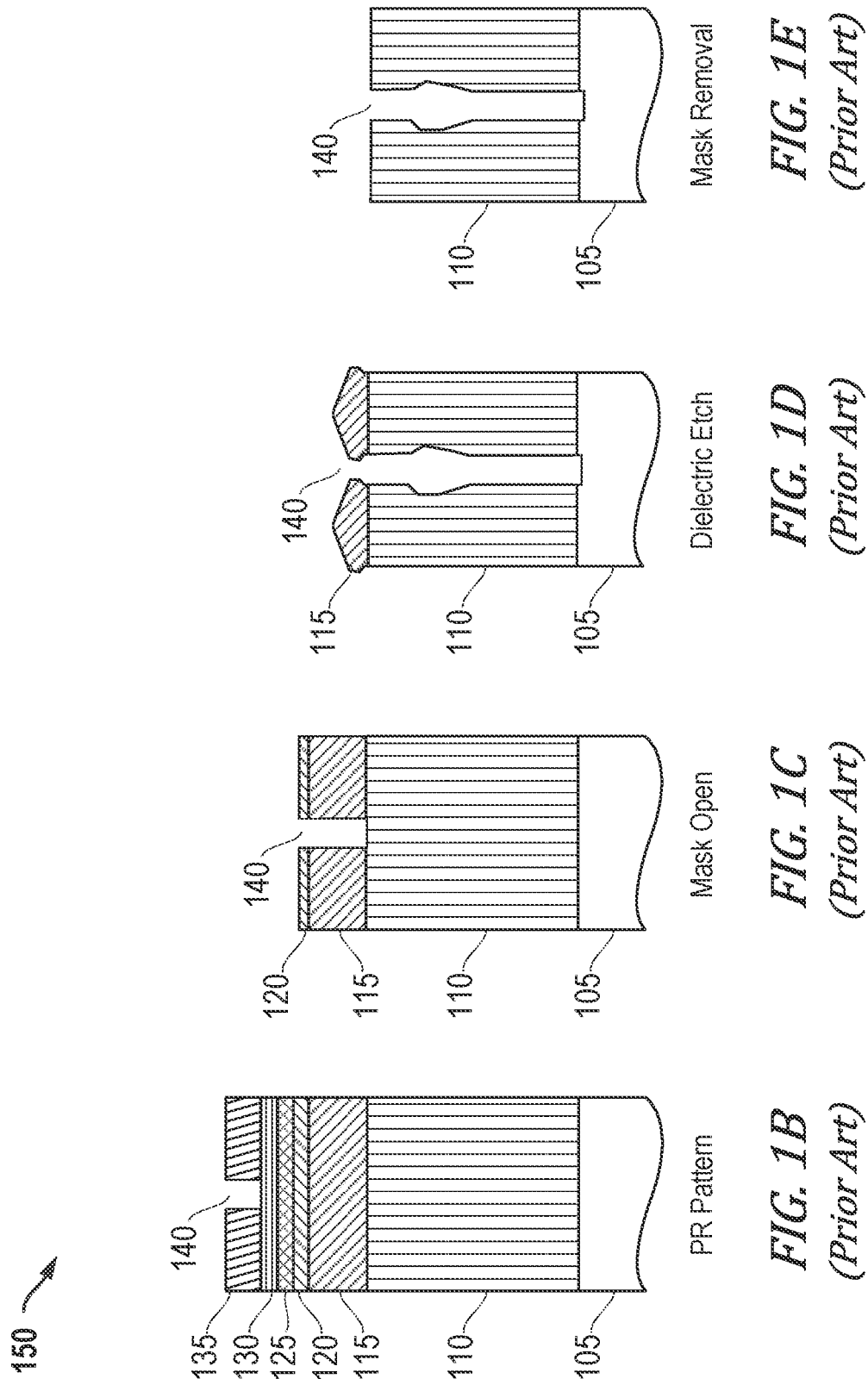

Polymer Clogging

Narrowing of
Etched Features

Mask Erosion

Mask Deformation & Necking

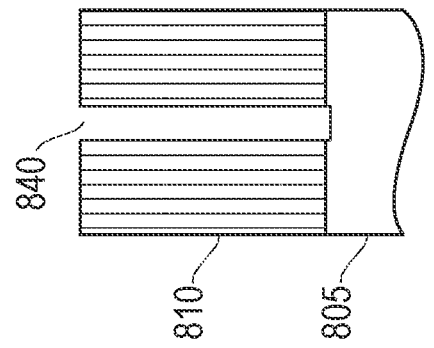
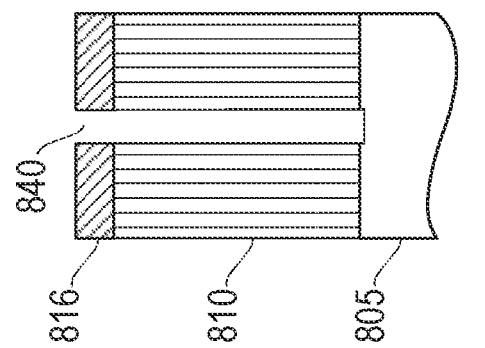
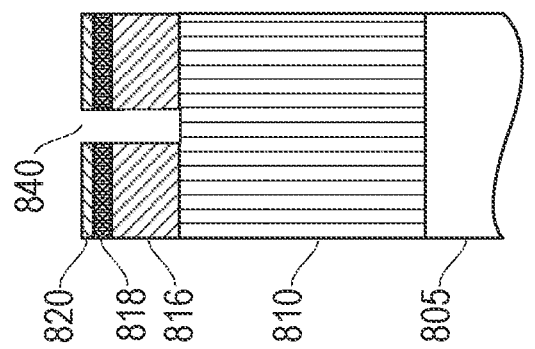
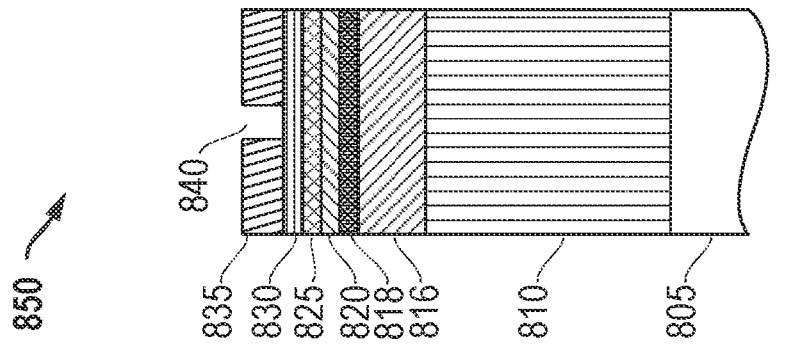

METHOD FOR ETCHING HIGH ASPECT RATIO FEATURES WITHIN A DIELECTRIC USING A HARD MASK STACK HAVING MULTIPLE HARD MASK LAYERS

BACKGROUND

The present disclosure relates to the processing of substrates. In particular, it provides methods for improving the profile of high aspect ratio (HAR) features etched within dielectric.

Semiconductor device formation typically involves a series of manufacturing techniques related to the formation, patterning, and removal of layers of material on a substrate. To meet the physical and electrical specifications of current and next generation semiconductor devices, process flows are being requested to reduce feature size while maintaining structure integrity for various patterning processes.

Three-dimensional (3D) stacked semiconductor memory, such as 3D-NAND flash memory or the like, includes a multilayer vertical stack in which different types of layers are laminated together in an alternating fashion. In some cases, a large number of dielectric and conductive layers (e.g., up to 192 layers or more) may be included within the multilayer vertical stack. After the multilayer vertical stack is formed on a base layer (e.g., a semiconductor substrate), a dielectric etch process may be performed to form deep holes (or "channels") that extend from the top of the multilayer vertical stack to the base layer. The channels formed within the multilayer vertical stack enable individual memory cells of a 3D-NAND flash memory device to connect with one another in the multilayer vertical stack. Each channel formed within the multilayer vertical stack must be parallel and uniform. To achieve this, the dielectric etch process used to form the channels must be carefully controlled. Plasma etching is typically used to form the deep holes within the multilayer vertical stack of a 3D-NAND flash memory device.

Before the multilayer vertical stack is etched, a hard mask (HM) layer is deposited onto the vertical stack to pattern the stack during the dielectric etch process. In 3D NAND flash memory devices, amorphous carbon layer (ACL) is often used as a hard mask material for the dielectric etch process, due to its relatively good etch selectivity to dielectric. After the ACL hard mask layer is deposited, a number of overlying layers, such as a photoresist (PR) layer, an antireflective coating (ARC) layer, etc., are formed on top of the ACL hard mask layer. After the overlying layers are formed, the PR layer is patterned using lithography techniques to create a pattern of the features (e.g., contact holes, vias, trenches, etc.) to be etched within the layers underlying the PR layer.

A number of etch processes may be utilized to etch the pattern of features within the layers underlying the PR layer. In some cases, for example, a first etch process may be performed to etch the pattern of features within the ACL hard mask layer in a "Mask Open" step, and a second etch process may be subsequently performed to extend the pattern of holes through the multilayer vertical stack in a "Dielectric Etch" step. As the number of layers in the multilayer vertical stack increase, the aspect ratio (AR) of the holes etched within the vertical stack increases. This results in a high aspect ratio (HAR) dielectric etch process that can be challenging for many reasons.

FIG. 1A (PRIOR ART) provides a cross-section view through a stacked structure 100 commonly used to form a 3D-NAND flash memory device. It is noted that the cross-section view shown in FIG. 1A is in a first direction perpendicular to the features (e.g., the contact holes, vias, trenches, etc.) to be formed within the multilayer vertical stack during subsequently performed etch processes. The stacked structure 100 shown in FIG. 1A includes a variety of layers formed on a base layer 105 (e.g., a semiconductor substrate, such as a wafer). These layers include, but are not limited to, a multilayer vertical stack 110, an ACL hard mask layer 115 formed on top of the multilayer vertical stack 110, and one or more overlying layers formed on top of the ACL hard mask layer 115. In the stacked structure 100 shown in FIG. 1A, the overlying layers formed on top of the ACL hard mask layer 115 include a hard mask layer 120, an organic dielectric layer (ODL) 125, an ARC layer 130 and a PR layer 135.

Although the layers 105, 110, 115, 120, 125, 130 and 135 shown in the FIG. 1A are not drawn to scale, FIG. 1A illustrates the use of a relatively thick ACL hard mask layer 115, which is formed on top of an even thicker multilayer vertical stack 110. A substantially thinner hard mask layer 120, such as an oxide or a silicon oxynitride (SiON) hard mask layer, is formed on top of the ACL hard mask layer 115. As described in more detail below with reference to FIGS. 1B-1E, the substantially thinner hard mask layer 120 is utilized during the mask open step to etch the pattern of holes within the ACL hard mask layer 115 before the ACL hard mask layer 115 is utilized during the dielectric etch step to extend the pattern of holes through the multilayer vertical stack 110.

FIGS. 1B-1E (Prior Art) are cross-section views through the stacked structure 100 shown in FIG. 1A, illustrating a conventional etch process 150 that may be used to etch high aspect ratio (HAR) features within the multilayer vertical stack 110. FIG. 1B illustrates a photoresist patterning step, which utilizes a lithography process to create a pattern of features 140 (e.g., contact holes, vias, trenches, etc.) within the PR layer 135. Only one feature 140 is shown in FIG. 1B for the sake of drawing clarity. FIG. 1C illustrates a mask open step, which utilizes one or more etch processes to etch (or "open") the pattern of features 140 with the ACL hard mask layer 115. The etch processes used to open the ACL hard mask layer 115 may generally be implemented as one or more plasma etch process steps. As shown in FIG. 1C, hard mask layer 120 is utilized as a hard mask during the mask open step. As the ACL hard mask layer 115 is etched, ion bombardment on the surface of the hard mask layer 120 causes portions of the hard mask layer 120 to be removed. In some cases, some or all of the hard mask layer 120 may be removed after the mask open step shown in FIG. 1C.

After the pattern of features 140 is etched within the ACL hard mask layer 115, a dielectric etch process may be performed to extend the pattern of features 140 through the multilayer vertical stack 110, as shown in FIG. 1D. The dielectric etch process may also be implemented as one or more plasma etch process steps. As shown in FIG. 1D, the ACL hard mask layer 115 is utilized as a hard mask during the dielectric etch process. As the multilayer vertical stack 110 is etched, ion bombardment on the surface of the ACL hard mask layer 115 causes portions of the ACL hard mask layer 115 to be removed. In some cases, some or all of the ACL hard mask layer 115 may be removed during the dielectric etch step. Once the pattern of features 140 is fully etched within the multilayer vertical stack 110, remaining portions of the ACL hard mask layer 115 are removed from the surface of the multilayer vertical stack 110 in the mask removal step shown in FIG. 1E. For example, plasma etching or ashing may be used to remove the ACL hard mask layer 115 in FIG. 1E.

As the number of layers within 3D semiconductor memory devices (such as 3D-NAND flash memory and the like) increase, plasma etching of high aspect ratio (HAR) features within the multilayer vertical stack 110 (or other thick dielectric layers) becomes increasingly more challenging. For example, bowing, twisting and bottom degradation/distortion for contacts and vias, and wiggling for trenches, are key challenges encountered when etching HAR features within dielectric. Improved stacked structures, processes and methods are needed to overcome these key challenges.

SUMMARY

The present disclosure provides various embodiments of stacked structures, process steps and methods for etching high aspect ratio (HAR) features (e.g., contact holes, vias, trenches, etc.) within one or more underlying layers of a stacked structure to reduce or eliminate problems that occur during conventional HAR etch processes (such as, e.g., bowing, twisting, distortion and wiggling of HAR features etched within the underlying layers). According to one embodiment, a stacked structure in accordance with the present disclosure may include a hard mask (HM) stack formed above one or more underlying layers formed on a semiconductor substrate. The HM stack may include at least one silicon-containing hard mask layer formed above a carbon-containing hard mask layer, and may be utilized during one or more etch processes as a combined hard mask for etching HAR features within the one or more underlying layers. In some embodiments, the HAR features etched within the one or more underlying layers may have an aspect ratio greater than 20. In one example embodiment, the aspect ratio of the HAR features may range between approximately 20 and 100.

In some embodiments, the HM stack may include one or more relatively thin (e.g., about 100 nm to 5 μm) silicon-containing hard mask layers, which are formed above a relatively thick (e.g., about 1 μm to 4 μm) carbon-containing hard mask layer. The carbon-containing hard mask layer may be formed above one or more underlying layers having a combined thickness ranging, for example, between 1 μm-25 μm. In one example embodiment, the carbon-containing hard mask layer may be an amorphous carbon layer (ACL) hard mask layer, and the at least one silicon-containing hard mask layer may be an amorphous silicon (a-Si) hard mask layer, a polycrystalline silicon (poly-Si) hard mask layer, a metal silicide hard mask layer and/or another silicon-containing hard mask layer. Examples of metal silicides that may be utilized within the HM stack disclosed herein include, but are not limited to, a tungsten silicide ($W_xSi_y$), a titanium silicide ($Ti_xSi_y$), a cobalt silicide ($Co_xSi_y$), a nickel silicide ($Ni_xSi_y$), an aluminum silicide ($Al_xSi_y$), a molybdenum silicide ($Mo_xSi_y$), a tantalum silicide($Ta_xSi_y$), a platinum silicide ($Pt_xSi_y$), etc. Other metal-silicon-containing hard mask materials may also be utilized within the HM stack.

When the stacked structure disclosed herein is subsequently etched to form HAR features within the one or more underlying layers, such as contact holes, vias or trenches that extend through the underlying layer(s), the at least one silicon-containing hard mask layer acts as a sacrificial layer to protect the carbon-containing hard mask layer during the etch process, thereby preventing mask erosion, deformation and necking of the carbon-containing hard mask layer. By protecting the integrity of the carbon-containing hard mask layer during the etch process, the at least one silicon-containing hard mask layer improves the profile of the HAR features etched within the underlying layer(s), for example, by reducing or eliminating bowing, twisting, distortion and/or wiggling of the etched features. The at least one silicon-containing hard mask layer also increases the etch resistance of the combined HM stack during the etch process. In doing so, the at least one silicon-containing hard mask layer improves the selectivity of the combined HM stack to the underlying layers and increases mask margin.

According to a first embodiment, a method is provided that utilizes the techniques described herein to etch high aspect ratio (HAR) features within one or more dielectric layers. In some embodiments, the method may include forming the one or more dielectric layers on a substrate, the one or more dielectric layers having a thickness greater than 1 μm, and forming a hard mask (HM) stack on the one or more dielectric layers. The HM stack may include at least one silicon-containing hard mask layer formed above a carbon-containing hard mask layer. The method may further include performing a first etch process to etch the HAR features through the HM stack and performing a second etch process to etch the HAR features through the one or more dielectric layers using the HM stack as a hard mask, wherein the HAR features etched within the one or more dielectric layers have an aspect ratio greater than 20. During the second etch process, the at least one silicon-containing hard mask layer: (a) serves as a sacrificial layer to protect the carbon-containing hard mask layer, and (b) improves a selectivity of the HM stack to the one or more dielectric layers underlying the HM stack.

A wide variety of materials may be included within the HM stack. In some embodiments, for example, the carbon-containing hard mask layer may include an amorphous carbon layer (ACL) hard mask layer or an Advanced Patterning Film (APF) hard mask layer. The at least one silicon-containing hard mask layer may generally include one or more of the following: an amorphous silicon hard mask layer, a polycrystalline silicon hard mask layer and a metal silicide hard mask layer. In some embodiments, the at least one silicon-containing hard mask layer may include more than one silicon-containing hard mask layer. For example, the at least one silicon-containing hard mask layer may include an amorphous silicon hard mask layer or a polycrystalline silicon hard mask layer, and may further include a metal silicide hard mask layer. When a metal silicide hard mask layer is included, the metal silicide hard mask layer may be selected from a group consisting of a tungsten silicide ($W_xSi_y$), a titanium silicide ($Ti_xSi_y$), a cobalt silicide ($Co_xSi_y$), a nickel silicide ($Ni_xSi_y$), an aluminum silicide ($Al_xSi_y$), a molybdenum silicide ($Mo_xSi_y$), a tantalum silicide ($Ta_xSi_y$) and a platinum silicide ($Pt_xSi_y$). In one example embodiment, the at least one silicon-containing hard mask layer may include a tungsten silicide hard mask layer. In such an embodiment, a thickness of the tungsten silicide hard mask layer may range between 100 nm and 5 μm.

In some embodiments, the method may further include forming an additional hard mask layer on the HM stack prior to performing the first etch process, wherein said performing the first etch process uses the additional hard mask layer as a hard mask when etching the HAR features through the HM stack. The additional hard mask layer may include a wide variety of hard mask materials including, but not limited to, oxide, silicon nitride (SiN), silicon oxynitride (SiON), silicon oxide (SiO), doped SiO, titanium (Ti) or titanium nitride (TiN). In some embodiments, the method may further include removing the additional hard mask layer during or after the first etch process. In other embodiments, at least a portion of the additional hard mask layer may remain on the HM stack at the beginning of the second etch process.

According to a second embodiment, another method is provided that utilizes the techniques described herein to improve the profile of high aspect ratio (HAR) features etched within a stacked structure. In some embodiments, the method may begin by forming a stacked structure on a substrate, wherein said forming the stacked structure includes: forming one or more underlying layers on the substrate, the one or more underlying layers having a thickness greater than 1 μm; forming a hard mask (HM) stack above the one or more underlying layers, the HM stack comprising a metal silicide hard mask layer formed above an amorphous carbon layer (ACL) hard mask layer; and forming an additional hard mask layer on the HM stack. The method may further include performing a first etch process to etch the HAR features through the HM stack using the additional hard mask layer as a hard mask and performing a second etch process to etch the HAR features through the one or more underlying layers using the HM stack as a hard mask, wherein the HAR features etched within the one or more underlying layers have an aspect ratio greater than 20. During the second etch process, the metal silicide hard mask layer improves the profile of the HAR features etched within the one or more underlying layers by preventing erosion, deformation and/or necking of the ACL hard mask layer.

The method in accordance with the second embodiment may be used to improve the profile of HAR features etched within one or more layers underlying a HM stack comprising a metal silicide hard mask layer formed above an ACL hard mask layer. In some embodiments, a thickness of the metal silicide hard mask layer may range between 100 nm and 5 μm, a thickness of the ACL hard mask layer may range between 1 μm and 4 μm, and a thickness of the one or more underlying layers may range between 1 μm and 25 μm. In some embodiments, an aspect ratio of the high aspect ratio features etched within the one or more underlying layers may range between 20 and 100 (or more).

A wide variety of underlying layers may be used within the stacked structure. In one embodiment, for example, the one or more underlying layers may include at least one dielectric layer, and the ACL hard mask layer may be formed above and in contact with the at least one dielectric layer. In another embodiment, the one or more underlying layers may include a multilayer vertical stack of alternating layers of dielectric material and conductive material, and the ACL hard mask layer may be formed above and in contact with a dielectric material layer of the multilayer vertical stack.

A wide variety of metal silicide materials may also be used within the HM stack. In one embodiment, for example, the metal silicide hard mask layer may be selected from a group consisting of a tungsten silicide ($W_xSi_y$), a titanium silicide ($Ti_xSi_y$), a cobalt silicide ($Co_xSi_y$), a nickel silicide ($Ni_xSi_y$), an aluminum silicide ($Al_xSi_y$), a molybdenum silicide ($Mo_xSi_y$), a tantalum silicide ($Ta_xSi_y$) and a platinum silicide ($Pt_xSi_y$). In one example embodiment, the metal silicide hard mask layer may be a tungsten silicide hard mask layer having a thickness that ranges between 100 nm and 5 μm.

The first etch process and the second etch process may each utilize a variety of etch chemistries for etching the HAR features within the corresponding layers. In some embodiments, the first etch process may use an etch chemistry comprising sulfur-containing process gases, chlorine-containing process gases and oxygen-containing process gases to etch the HAR features through the HM stack. In one example embodiment, the first etch process may utilize chlorine ($Cl_2$), oxygen ($O_2$) and argon (Ar) process gases to etch the HAR features through the metal silicide hard mask layer, and may utilize sulfur dioxide ($SO_2$) and oxygen ($O_2$) process gases to etch the HAR features through the ACL hard mask layer. The process gases utilized within the first etch process may be provided at a variety of pressure, power, flow and temperature conditions to etch the HAR features within the HM stack.

In some embodiments, the second etch process may use a fluorocarbon etch chemistry to etch the HAR features through the one or more underlying layers. For example, process gases utilized within the second etch process may be selected from a group consisting of $C_4F_6$, $C_4F_8$, $C_3F_6$, $C_3F_8$, $CH_2F_2$, $CHF_3$, and $CF_4$. One or more of these fluorocarbon process gases can be optionally combined with oxygen ($O_2$) and/or one or more dilution gases (e.g., krypton, argon, nitrogen, carbon monoxide, etc.) at a variety of pressure, power, flow and temperature conditions to etch the HAR features within the one or more underlying layers. In one example embodiment, a fluorocarbon, oxygen and krypton etch chemistry may be used to etch the HAR features through the one or more underlying layers.

According to a third embodiment, another method is provided that utilizes the techniques described herein to etch a pattern of contact holes within a stacked structure included within a three-dimensional (3D) stacked semiconductor memory, such as a 3D-NAND Flash memory device or the like. In some embodiments, the method may begin by forming the stacked structure on a substrate, wherein said forming the stacked structure includes: forming a multilayer vertical stack comprising alternating layers of dielectric material and conductive material, the multilayer vertical stack having a thickness greater than 1 μm; forming an amorphous carbon layer (ACL) hard mask layer above a dielectric material layer of the multilayer vertical stack; and forming at least one silicon-containing hard mask layer on the ACL hard mask layer, the at least one silicon-containing hard mask layer and the ACL hard mask layer forming a hard mask (HM) stack. The method may further include performing a first etch process to etch the pattern of contact holes through the HM stack and performing a second etch process to etch the pattern of contact holes through the multilayer vertical stack, wherein the pattern of contact holes etched within the multilayer vertical stack are high aspect ratio features having an aspect ratio greater than 20. During said second etch process, the at least one silicon-containing hard mask layer prevents erosion, deformation and/or necking of the ACL hard mask layer.

The method in accordance with the third embodiment may be used to improve the profile of HAR features etched within a multilayer vertical stack underlying a HM stack comprising at least one silicon-containing hard mask layer formed above an ACL hard mask layer. In some embodiments, a thickness of the at least one silicon-containing hard mask layer may range between 100 nm and 5 μm, a thickness of the ACL hard mask layer may range between 1 μm and 4 μm, and a thickness of the multilayer vertical stack may range between 1 μm and 25 μm. In some embodiments, an aspect ratio of the high aspect ratio features etched within the multilayer vertical stack may range between 20 and 100 (or more).

A wide variety of silicon-containing hard mask materials may be included within the HM stack. In some embodiments, for example, the at least one silicon-containing hard mask layer may include one or more of the following: an amorphous silicon hard mask layer, a polycrystalline silicon hard mask layer and a metal silicide hard mask layer. In some embodiments, the at least one silicon-containing hard mask layer may include more than one silicon-containing hard mask layer. For example, the at least one silicon-containing hard mask layer may include a first silicon-containing hard mask layer and a second silicon-containing hard mask layer, which is different from the first silicon-containing hard mask layer.

In some embodiments, the at least one silicon-containing hard mask layer may include a metal silicide hard mask layer. When a metal silicide hard mask layer is included, the metal silicide hard mask layer may be selected from a group consisting of a tungsten silicide ($W_xSi_y$), a titanium silicide ($Ti_xSi_y$), a cobalt silicide ($Co_xSi_y$), a nickel silicide ($Ni_xSi_y$), an aluminum silicide ($Al_xSi_y$), a molybdenum silicide ($Mo_xSi_y$), a tantalum silicide ($Ta_xSi_y$) and a platinum silicide ($Pt_xSi_y$). In one example embodiment, the at least one silicon-containing hard mask layer may include a tungsten silicide hard mask layer. In such an embodiment, a thickness of the tungsten silicide hard mask layer may range between 100 nm and 5 μm.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 1B-1E (Prior Art) are cross-section views through the stacked structure shown in FIG. 1A, illustrating a conventional etch process used to etch high aspect ratio (HAR) features within the stacked structure.

FIGS. 8B-8E are cross-section views through the stacked structure shown in FIG. 8A, illustrating an etch process that may be used to etch HAR features within the stacked structure with improved profile control.

DETAILED DESCRIPTION

Figure 1A:
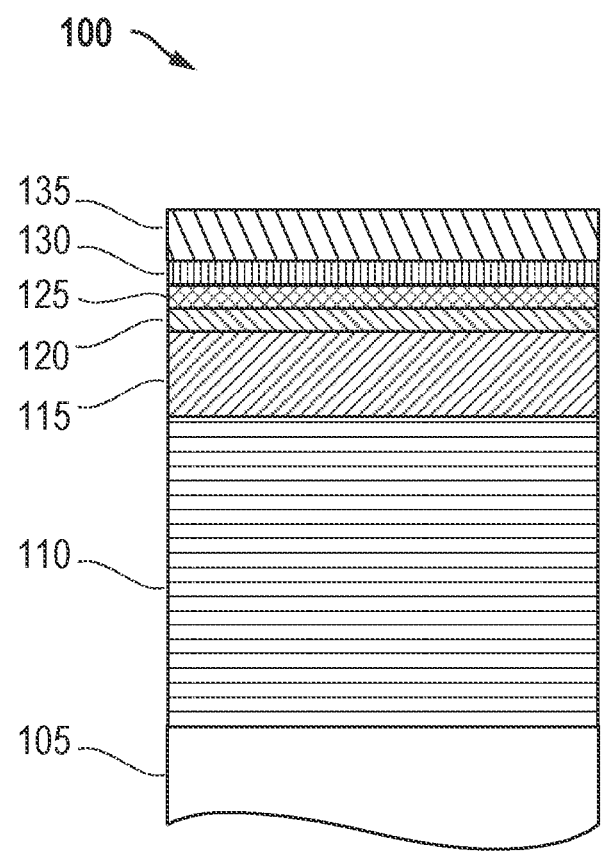
FIG. 1A (Prior Art) is a cross-section view through a stacked structure commonly used to form a 3D-NAND flash memory device.

The present disclosure provides various embodiments of stacked structures, process steps and methods for etching high aspect ratio (HAR) features (e.g., contact holes, vias, trenches, etc.) within one or more underlying layers of a stacked structure to reduce or eliminate problems that occur during conventional HAR etch processes (such as, e.g., bowing, twisting, distortion and/or wiggling of HAR features etched within the underlying layers). As described in more detail below and illustrated in FIGS. 8A-8E of the Drawings, a stacked structure in accordance with the present disclosure includes a hard mask (HM) stack formed above and in contact with one or more underlying layers formed on a semiconductor substrate. The HM stack shown in FIGS. 8A-8E includes at least one silicon-containing hard mask layer formed above a carbon-containing hard mask layer, and is utilized during one or more etch processes as a combined hard mask for etching the HAR features within the underlying layer(s). In some embodiments, the HAR features etched within the underlying layer(s) may have an aspect ratio greater than 20. In one example embodiment, the aspect ratio of the HAR features may range between approximately 20 and 100.

In some embodiments, the HM stack may include one or more relatively thin (e.g., about 100 nm to 5 μm) silicon-containing hard mask layers, which are formed on top of a relatively thick (e.g., about 1 μm to 4 μm) carbon-containing hard mask layer. The carbon-containing hard mask layer may be formed on top of one or more underlying layers having a combined thickness ranging, for example, between 1 μm to 25 μm. In one example embodiment, the carbon-containing hard mask layer may be an amorphous carbon layer (ACL) hard mask layer, and the at least one silicon-containing hard mask layer may contain one or more of the following: an amorphous silicon (a-Si) hard mask layer, a polycrystalline silicon (poly-Si) hard mask layer, a metal silicide hard mask layer and/or another silicon-containing hard mask layer. Examples of metal silicides that may be utilized within the HM stack disclosed herein include, but are not limited to, a tungsten silicide ($W_xSi_y$), a titanium silicide ($Ti_xSi_y$), cobalt silicide ($Co_xSi_y$), nickel silicide ($Ni_xSi_y$), aluminum silicide ($Al_xSi_y$), molybdenum silicide ($Mo_xSi_y$), tantalum silicide ($Ta_xSi_y$), platinum silicide ($Pt_xSi_y$), etc. Other metal-silicon-containing hard mask materials may also be utilized within the HM stack.

When the stacked structure is subsequently etched to form high aspect ratio features within the underlying layers(s), such as contact holes, vias or trenches that extend through the underlying layer(s), the at least one silicon-containing hard mask layer acts as a sacrificial layer to protect the carbon-containing hard mask layer and increases the etch resistance of the combined HM stack during the etch process. In doing so, the silicon-containing hard mask layer prevents erosion, deformation and necking of the carbon-containing hard mask layer during the etch process. In other words, adding the silicon-containing hard mask layer to the HM stack protects the integrity of the carbon-containing hard mask layer during the etch process, which in turn, improves the profile of the HAR features etched within the underlying dielectric layer(s) by reducing or eliminating bowing, twisting, distortion and/or wiggling of the etched features.

The techniques described herein may be used to improve the profile of high aspect ratio features etched within a wide variety of underlying layers. In some embodiments, the underlying layers may include one or more dielectric layers. In other embodiments, the underlying layers may include a multilayer vertical stack of alternating layers of dielectric and conductive material. In one particular embodiment, the multilayer vertical stack may be part of a three-dimensional (3D) stacked semiconductor memory, such as a 3D NAND flash memory device or the like. While the techniques described herein are particularly useful for etching high aspect ratio (HAR) features within one or more underlying dielectric layers, one skilled in the art would understand how the techniques described herein may be applied for etching HAR within other relatively thick underlying layers.

Figure 2:
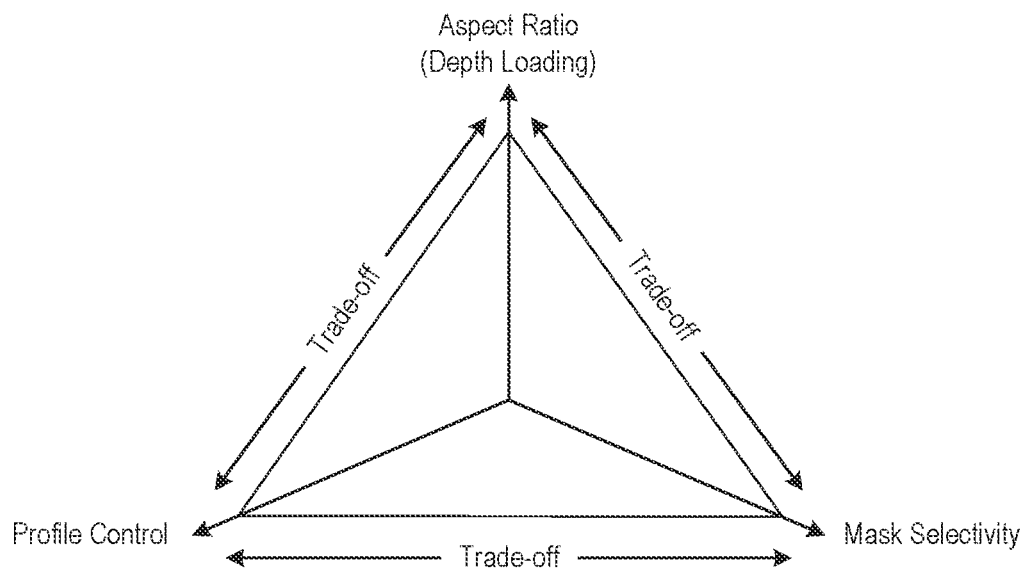
FIG. 2 is a graphic illustrating various trade-offs (such as, e.g., aspect ratio, mask selectivity and profile control) that must be considered when etching HAR features.

As noted above in the Background Section, plasma etching of HAR features becomes increasingly more challenging as the thickness of the etched layer(s), and thus, the aspect ratio of the etched features, increases. The graphic 200 shown in FIG. 2 illustrates various trade-offs that should be considered when etching HAR features within relatively thick underlying layers, such as one or more dielectric layers or a multilayer vertical stack of alternating layers of dielectric and conductive material. For example, FIG. 2 indicates that trade-offs exist between: (a) aspect ratio and mask selectivity, (b) mask selectivity and profile control, and (c) aspect ratio and profile control when plasma etching is utilized to etch HAR features (e.g., features having aspect ratios>20) within thick (e.g., >1 µm) underlying layers. These trade-offs are discussed in more detail below in reference to FIGS. 3-7.

Figure 3:
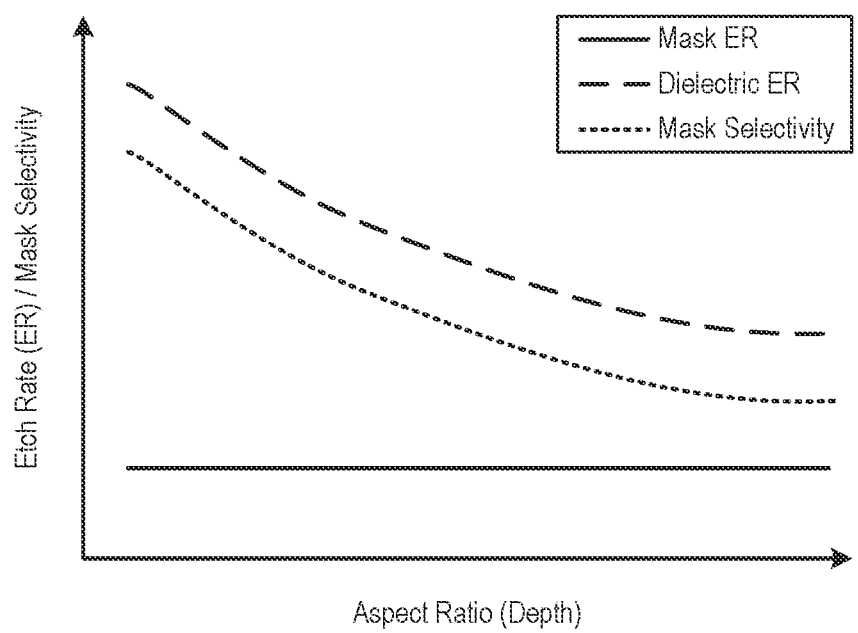
FIG. 3 is a graph illustrating how the dielectric etch rate (ER) and hard mask selectivity decrease with increasing aspect ratio, while the etch rate of the hard mask stays the same.
Figure 4:
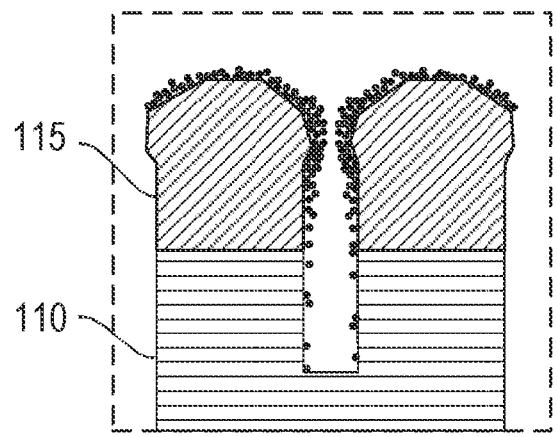
FIGS. 4-7 (Prior Art) are cross-section views through the stacked structure shown in FIG. 1A, illustrating problems (such as, e.g., polymer clogging, narrowing of etched features, and erosion, deformation and necking of the hard mask layer) that commonly occur during the dielectric etch process shown in FIG. 1D.
Figure 5:
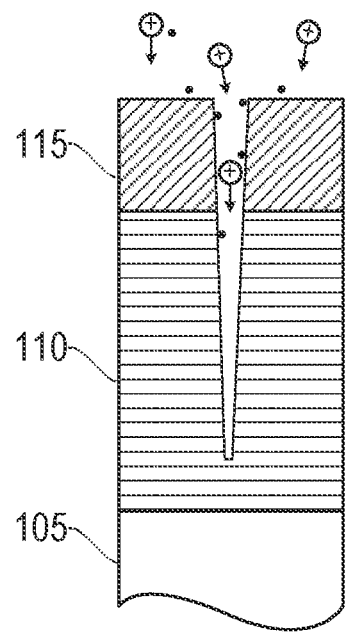

The graph 300 shown in FIG. 3 illustrates that, as the aspect ratio of an etched feature increases, the etch rate of the underlying dielectric layer(s) decreases, while the etch rate of the hard mask layer stays the same. This leads to a decrease in mask selectivity and low mask margin. In an effort to maintain high mask selectivity during the dielectric etch, some conventional etch processes utilize a polymer rich etch condition to etch the underlying dielectric layer(s). However, polymer rich etch conditions may cause uneven polymer deposition on sidewall surfaces of the ACL hard mask layer 115, which may lead to polymer clogging and narrow necking of the hard mask layer (see, FIG. 4) and mask transfer roughness when the pattern of features is transferred from the ACL hard mask layer 115 to the underlying layer(s) of the multilayer vertical stack 110.

Aspect ratio dependent etching (ARDE) is also limited by ion and radical directionality and transport. As the aspect ratio of an etched feature increases, for example, ion energy and ion and radical transport decrease in deeper areas of the etched feature, which results in Etch Rate drop and tapering of the HAR features etched within the underlying layer(s) of the multilayer vertical stack 110, as shown for example, in FIG. 5. This profile tapering results in low Bottom/Top (B/T) Ratio, small Bottom CD, Etch Stop, and Under Etch (UE).

Figure 6:
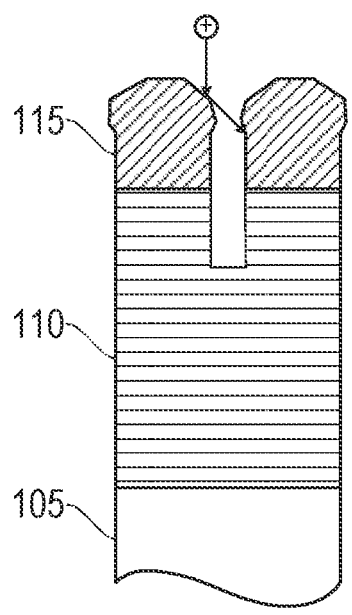
Figure 7:
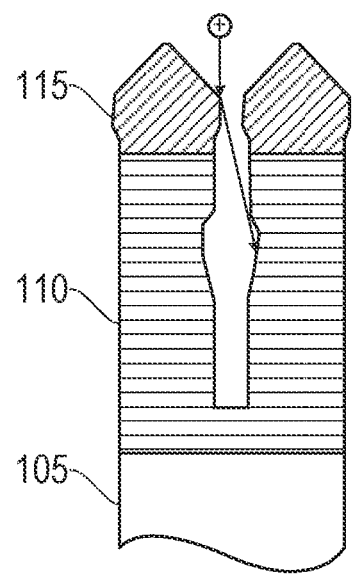

In some cases, ion directionality (e.g., verticality) and ion transport to deeper areas of the etched feature can be improved by increasing the low frequency (LF) power utilized during the plasma etch process. Although high LF power increases the ion energy within the generated plasma, it often leads to erosion, deformation and necking of the hard mask layer used during the plasma etch process. As shown in FIG. 6, for example, ion bombardment on the surface of the ACL hard mask layer 115 leads to mask erosion (or mask top tapering), which increases ion scattering within the etched feature. The increased ion scattering causes additional mask deformation and necking, as shown in FIG. 7, which leads to an imbalance of ions and neutrals flux within the etched feature and results in bowing, twisting, distortion and wiggling of the HAR features etched within the underlying layer(s) of the multilayer vertical stack 110.

Figure 8A:
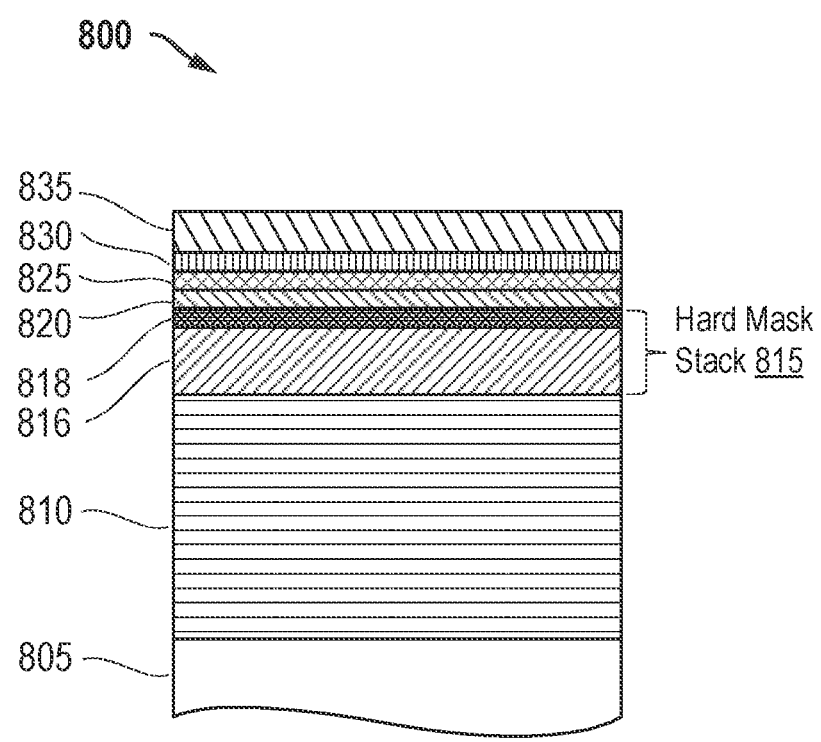
FIG. 8A is a cross-section view through a stacked structure including a hard mask (HM) stack in accordance with the present disclosure.

FIG. 8A illustrates one embodiment of a stacked structure 800 that utilizes the techniques described herein to reduce or eliminate problems, such as bowing, twisting, distortion and/or wiggling of HAR features etched within conventional stacked structures, such as the stacked structure 100 shown in FIGS. 1A-1E and FIGS. 4-7. Unlike the stacked structure 100, the stacked structure 800 shown in FIG. 8A utilizes a hard mask (HM) stack 815 during the dielectric etch process to improve the profile of high aspect ratio features etched within one or more dielectric layers 810 underlying the HM stack 815. As described in more detail below, the HM stack 815 described herein may generally include at least one silicon-containing hard mask layer 818 formed above a carbon-containing hard mask layer 816.

FIG. 8A provides a cross-section view through a stacked structure 800 in accordance with one embodiment of the present disclosure. FIGS. 8A-8E illustrate one embodiment of an etch process 850 that may be used to etch HAR features within the stacked structure 800 with improved profile control. In FIGS. 8A-8E, cross-section views are provided for example embodiments of stacked structures and process steps that reduce or eliminate problems, such as bowing, twisting, distortion and/or wiggling of the HAR features etched within the underlying dielectric layer(s) that typically occur during conventional dielectric etch processes. It is noted that these cross-section views are in a first direction perpendicular to the features (e.g., contact holes, vias, trenches, etc.) being formed in the stacked structure 800. In one embodiment, a plasma processing system may be utilized to perform one or more of the process steps shown in FIGS. 8A-8E.

In some embodiments, the process steps shown in FIGS. 8A-8E can be used as part of a 3D memory fabrication process where the HM stack 815 is opened to provide a pattern of features 840 (e.g., contact holes, vias, trenches, etc.) to be transferred to a relatively thick (e.g., >1 µm) multilayer vertical stack underlying the HM stack. In other embodiments, the process steps shown in FIGS. 8A-8E can be used to etch a pattern of features 840 within a relatively thick (e.g., >1 µm) dielectric layer, or a dielectric layer stack, underlying the HM stack 815. As described in more detail below, the pattern of features 840 etched within the dielectric layer(s) or the multilayer vertical stack may be high aspect ratio (HAR) features having an aspect ratio greater than 20. It is recognized that the material layers and layer depths shown in FIGS. 8A-8E are not drawn to scale.

FIG. 8A illustrates a process step where a stacked structure 800 has been formed on a base layer 805, such as a semiconductor substrate. As shown in FIG. 8A, the stacked structure 800 may generally include, but is not limited to, one or more underlying layers 810 formed on the base layer 805, a hard mask (HM) stack 815 formed above the underlying layer(s) 810, and one or more overlying layers (e.g., layers 820, 825, 830 and 835) formed above the HM stack 815. Unlike the stacked structure 100 shown in FIGS. 1A-1E, the stacked structure 800 shown in FIG. 8A provides a HM stack 815 on top of the underlying layer(s) 810 to improve the etch profile of the high aspect ratio features etched within the underlying layer(s) 810. The HM stack 815 provided within the stacked structure 800 may generally include a carbon-containing hard mask layer 816 formed on top of the underlying layer(s) 810 and at least one silicon-containing hard mask layer 818 formed on top of the carbon-containing hard mask layer 815.

In some embodiments, the carbon-containing hard mask layer 816 may be an amorphous carbon layer (ACL) hard mask layer, an Advanced Patterning Film (APF) (commercially available from Applied Materials) or another carbon-containing hard mask material that exhibits good etch selectivity to dielectric. A wide variety of ACL hard mask materials and other carbon-containing hard mask materials may be utilized within the HM stack 815 shown in FIG. 8A. In some cases, for example, a variety of ACL hard mask materials having different carbon:hydrogen ratios may be considered. As known in the art, the amount of hydrogen included within a given ACL hard mask material determines its optical properties, as well as its etch resistance to a given etch chemistry. As the amount of hydrogen decreases, certain optical properties (such as the absorption coefficient, k) of the ACL hard mask material increase. Likewise, as the amount of hydrogen decreases, the etch resistance of the ACL hard mask material may also increase (depending on the etch chemistry used), leading to a decreased etch rate. In some embodiments, a carbon-containing hard mask material (e.g., an ACL hard mask material or another carbon-containing hard mask material) having a desired etch resistance, and thus, a desired mask selectivity (e.g., a mask selectivity greater than 3), for a given etch chemistry may be selected for use within the HM stack 815.

In some embodiments, the carbon-containing hard mask layer 816 may be deposited to a thickness or depth ranging, for example, between 1 μm and 4 μm. In one example embodiment, a 2.5-3 μm thick ACL hard mask material may be utilized within the HM stack 815 for etching an approximately 10 μm thick multilayer vertical stack comprising alternating layers of oxide and nitride (ONON). In such an embodiment, the ACL hard mask material included within the HM stack 815 may exhibit an etch selectivity of at least 7:1 to the underlying ONON layers when a fluorocarbon etch chemistry (containing, e.g., CxFy) is used to etch the ONON layers. It is recognized, however, that the etch selectivity of the carbon-containing hard mask layer 816 to the underlying layer(s) 810 may differ from the example provided above, depending on the material composition of the carbon-containing hard mask layer 816, the material composition of the underlying layer(s) 810 and the etch chemistry used to etch the underlying layer(s) 810.

A wide variety of silicon-containing hard mask materials may be utilized within the HM stack 815 shown in FIG. 8A. In some embodiments, for example, the at least one silicon-containing hard mask layer 818 may contain one or more of the following: an amorphous silicon (a-Si) hard mask layer, a polycrystalline silicon (poly-Si) hard mask layer, a metal silicide hard mask layer and/or another silicon-containing hard mask layer. Examples of metal silicides that may be utilized within the HM stack 815 include, but are not limited to, a tungsten silicide ($W_xSi_y$), titanium silicide ($Ti_xSi_y$), cobalt silicide ($Co_xSi_y$), nickel silicide ($Ni_xSi_y$), aluminum silicide ($Al_xSi_y$), molybdenum silicide ($Mo_xSi_y$), tantalum silicide ($Ta_xSi_y$), platinum silicide ($Pt_xSi_y$), etc. Other metal-silicon-containing hard mask materials may also be utilized within the HM stack 815. As such, the present disclosure contemplates that a wide variety of silicon-containing hard mask materials and metal-silicon-containing hard mask materials may be utilized within the HM stack 815.

A particular silicon-containing hard mask material may be selected for use within the HM stack 815 based on its etch selectivity to the underlying layer(s) 810 and/or its etch resistance to a given etch chemistry used to etch HAR features within the underlying layer(s) 810. In some embodiments, for example, an amorphous silicon (a-Si) or polycrystalline silicon (poly-Si) hard mask material may be utilized with the HM stack 815. Experimental results show that the etch resistance of amorphous silicon is approximately 30-50% higher than ACL hard mask materials, depending on the particular ACL hard mask material and the etch chemistry used to etch the HAR features within the underlying layer(s) 810. In other embodiments, a metal silicide hard mask material, such as tungsten silicide ($W_xSi_y$), may be utilized with the HM stack 815. Experimental results show that the etch resistance of tungsten silicide hard mask materials is approximately 60-70% higher than ACL hard mask materials, depending on the particular ACL hard mask material, the amount of tungsten included within the tungsten silicide hard mask material and the etch chemistry utilized. Higher concentrations of tungsten within the tungsten silicide hard mask material provide higher etch resistance. Other silicon-containing hard mask materials and metal-silicon-containing hard mask materials may also be used, and may exhibit different etch resistances when etching HAR features within the underlying layer(s) 810 using various etch chemistries. As such, the material composition of the at least one silicon-containing hard mask layer 818 may be selected accordingly.

In some embodiments, the at least one silicon-containing hard mask layer 818 may be deposited to a thickness or depth ranging, for example, between 100 nm to 5 μm. In some embodiments, more than one silicon-containing hard mask layer 818 may be utilized within the HM stack 815. For example, the at least one silicon-containing hard mask layer 818 may include both a silicon-containing hard mask material (e.g., a-Si or poly-Si) and a metal-silicon-containing hard mask material (e.g., $W_xSi_y$, $Ti_xSi_y$, $Co_xSi_y$, $Ni_xSi_y$, $Al_xSi_y$, $Mo_xSi_y$, $Ta_xSi_y$, $Pt_xSi_y$, etc.). When more than one silicon-containing hard mask layer 818 is utilized within the HM stack 815, each layer may be deposited to a thickness or depth ranging between 100 nm to 5 μm.

The at least on silicon-containing hard mask layer 818 included within the HM stack 815 exhibits a higher etch resistance to the etch chemistry used to etch the underlying layer(s) 810, and thus, exhibits a higher etch selectivity (e.g., greater than 5) to the underlying layer(s) 810 than the carbon-containing hard mask layer 816. By including the at least on silicon-containing hard mask layer 818 within the HM stack 815, the at least on silicon-containing hard mask layer 818 improves the etch resistance of the combined HM stack and protects the integrity of the carbon-containing hard mask layer 816 during etching of the underlying layer(s) 810.

The HM stack 815 shown in FIG. 8A may be utilized for etching a wide variety of underlying layer(s) 810. In some embodiments, the one or more underlying layers 810 may include a dielectric material (such as, e.g., an oxide). In such embodiments, the carbon-containing hard mask layer 816 may be formed above and in contact with the dielectric material. In other embodiments, the one or more underlying layers 810 may be implemented as a multilayer vertical stack comprising alternating layers of dielectric and conductive materials, such as for example, alternating layers of oxide and nitride (ONON), alternating layers of silicon oxide and polysilicon (OPOP), etc. In such embodiments, the carbon-containing hard mask layer 816 may be formed above and in contact with a dielectric material layer of the multilayer vertical stack. In some embodiments, the stacked structure 800 shown in FIG. 8A may be used within a 3D stacked semiconductor memory, such as a 3D NAND flash memory device or the like. In some embodiments, the one or more underlying layers 810 may be deposited to a thickness or depth ranging, for example, between 1 µm to 25 µm. In one example embodiment, a deposition thickness of the one or more underlying layers 810 may be approximately 10 µm.

A wide variety of overlying layers may also be formed above the HM stack 815 and used to etch a pattern of features 840 within the HM stack 815. As shown in FIG. 8A, for example, the one or more overlying layers may include, but are not limited to, an additional hard mask layer 820, an organic dielectric layer (ODL) 825, an antireflective coating (ARC) layer 830 and a photoresist (PR) layer 835. Other layers may also be included within the stacked structure 800, as is known in the art.

A wide variety of materials may be used to form the layers 820, 825, 830 and 835 shown in FIG. 8A. For example, the PR layer 835 may include any photoresist used in 193 nm immersion technology, including positive tone or negative tone photoresist layers. The ARC layer 830 may include a silicon-containing ARC (SiARC) or a bottom ARC (BARC). The ODL 825 may include an organic planarization layer (OPL) ODL (commercially available from Shin-etsu Chemical, Co., Ltd). The additional hard mask layer 820 may include, but is not limited to, oxide, silicon nitride (SiN), silicon oxynitride (SiON), silicon oxide (SiO), doped SiO, titanium (Ti), and titanium nitride (TiN).

As described in more detail below with reference to FIG. 8C, the additional hard mask layer 820 may be utilized as a hard mask during the mask open step to etch (or "open") the pattern of features 840 within the HM stack 815. As such, the additional hard mask layer 820 may utilize any non-carbon containing hard mask material, which exhibits good selectivity to ACL or other carbon-containing hard mask materials that may be included within the carbon-containing hard mask layer 816. In some embodiments, the additional hard mask layer 820 may be removed during or after the mask open step, before the dielectric etch step is performed to etch the pattern of features 840 within the underlying layer(s) 810. In other embodiments, at least a portion of the additional hard mask layer 820 may remain on the HM stack 815 at the start of the dielectric etch step.

It is recognized that the additional hard mask layer 820 is an optional hard mask layer, which may or may not be included within the stacked structure 800 shown in FIG. 8A. In some embodiments, the additional hard mask layer 820 may be omitted from the stacked structure 800. In such embodiments, the at least one silicon-containing hard mask layer 818 may protect the integrity of the carbon-containing hard mask layer 816 during the subsequently performed mask open step (shown in FIG. 8C) and dielectric etch step (shown in FIG. 8D).

In one example embodiment, a stacked structure 800 in accordance with the present disclosure may include a 15-60 nm PR layer 835, a 20-40 nm ARC layer 830, a 200-400 nm ODL 825, a 100-400 nm additional hard mask layer 820, a 1-5 µm HM stack 815 including a 100 nm-1 µm silicon-containing hard mask layer 818 and a 1-4 µm carbon-containing hard mask layer 816 and a 1-11 µm underlying layer(s) 810, all of which is formed on a silicon substrate base layer 805. It is recognized that other layers, or additional layers, may also be used within the stacked structure 800, as is known in the art.

A wide variety of deposition techniques may be used to form the individual layers included within the stacked structure 800 shown in FIG. 8A. For example, these layers can be formed using one or more deposition processes including an atomic layer deposition (ALD) process, a chemical vapor deposition (CVD) process, a plasma enhanced CVD (PECVD) process, a physical vapor deposition (PVD) process, or other deposition processes or combinations of processes. Such processes may begin, in some embodiments, by depositing the one or more underlying layers 810 on the base layer 805.

Once the underlying layer(s) 810 are formed, another deposition process step may be performed to deposit the carbon-containing hard mask layer 816 onto the underlying layer(s) 810. After the carbon-containing hard mask layer 816 is formed, one or more additional deposition process steps may be performed to deposit the at least one silicon-containing hard mask layer 818 onto the carbon-containing hard mask layer 816 to form the HM stack 815. Further deposition process steps may be performed to deposit the overlying layers 820, 825, 830 and 835 onto the at least one silicon-containing hard mask layer 818. The deposition process steps used to form the layers 810, 816, 818, 820, 825, 830 and 835 may be performed using the same (or different) deposition technique (e.g., ALD, CVD, etc.) and suitable process gases. Such techniques and process gases may be known to those skilled in the art.

Once the layers 810, 816, 818, 820, 825, 830 and 835 are formed, one or more photolithography and etch process steps may be performed to etch (or "open") the pattern of features 840 within the one or more overlying layers 820, 825, 830 and 835 formed above the HM stack 815. FIG. 8B illustrates a photoresist (PR) patterning step, which utilizes a photolithography process to create a pattern of features 840 (e.g., contact holes, vias, trenches, etc.) within the PR layer 835. Only one feature 840 is shown in FIG. 8B for the sake of drawing clarity.

FIG. 8C illustrates a mask open step in which one or more etch processes are performed to etch the pattern of features 840 with the HM stack 815. In some cases, the etch process(es) used to open the HM stack 115 may be implemented as one or more plasma etch process steps. As shown in FIG. 8C, the additional hard mask layer 820 is utilized as a hard mask during the mask open step to pattern the underlying HM stack 815. As the HM stack 815 is etched, ion bombardment on the surface of the additional hard mask layer 820 causes portions of the additional hard mask layer 120 to be removed. In some cases, some or all of the additional hard mask layer 120 may be removed during the mask open step shown in FIG. 8C.

Once the pattern of features 840 has been etched with the HM stack 815, a dielectric etch process may be performed to extend the pattern of features 840 through the underlying layer(s) 810. The dielectric etch process may also be implemented as one or more plasma etch process steps. As shown in FIG. 8D, the HM stack 815 is utilized as a hard mask during the dielectric etch process. As the underlying layer(s) 810 is/are etched, ion bombardment on the surface of the HM stack 815 causes the additional hard mask layer 820, the at least one silicon-containing hard mask layer 818 and portions of the carbon-containing hard mask layer 816 to be removed. In some cases, some or all of the carbon-containing hard mask layer 816 may be removed during the dielectric etch step. Once the features 840 are fully etched within the underlying layer(s) 810, remaining portions of the carbon-containing hard mask layer 816 may be removed from the surface of the underlying layer(s) 810 in the mask removal step shown in FIG. 8E. For example, plasma etching or ashing may be used to remove any remaining portions of the carbon-containing hard mask layer 816 in FIG. 8E.

A wide variety of etch techniques may be used to etch the pattern of features 840 within the individual layers of the stacked structure 800 shown in FIG. 8A. For example, these layers can be etched using one or more etch processes including plasma etch processes, discharge etch processes, atomic layer etch (ALE) processes and/or other desired etch processes. In one example plasma etch process, a gas mixture can be used including but not limited to fluorocarbon gas chemistries (e.g., $C_4F_6$, $C_4F_8$, $C_3F_6$, $C_3F_8$, $CH_2F_2$, $CHF_3$, and/or $CF_4$) optionally in combination with oxygen ($O_2$) and one or more dilution gases (e.g., krypton, argon, nitrogen, carbon monoxide, etc.) at a variety of pressure, power, flow and temperature conditions to etch the underlying layer(s) 810. Operational parameters (e.g., source power, bias power, bias duty cycle, chamber pressure and plasma species, etc.) may be controlled to segregate the deposition and etch processes described herein.

As described above in the Background section, the stacked structure 100 shown in FIG. 1A and the conventional etch process 150 shown in FIGS. 1A-1C suffer from mask erosion, deformation and necking of the ACL hard mask layer 115 during the dielectric etch process, which in turn, leads to bowing, twisting, distortion and wiggling of the HAR features 140 etched within the underlying layer(s) 110 (see, e.g., FIGS. 1D and 6-7). In contrast, the stacked structure 800 shown in FIG. 8A and the etch process 850 shown in FIGS. 8A-8E improve the profile of the HAR features etched within the underlying layer(s) 810 by: (a) providing a HM stack 815 including at least one silicon-containing hard mask layer 818 and a carbon-containing hard mask layer 816 over the underlying layer(s) 810, and (b) utilizing the HM stack 815 to etch the HAR features (such as features 840) within the one or more underlying layers 810, such as contact holes, vias or trenches that extend through the underlying layer(s) 810. In some embodiments, the HAR features etched within the one or more underlying layers 810 may have an aspect ratio greater than 20. In one example embodiment, the aspect ratio of the HAR features etched within the underlying layer(s) 810 may range between approximately 20 and 100.

When the stacked structure 800 is etched to form HAR features within the underlying layer(s) 810, the at least one silicon-containing hard mask layer 818 acts as a sacrificial layer to protect the carbon-containing hard mask layer 816 during the dielectric etch process, thereby preventing mask erosion and deformation (caused, e.g., by ion bombardment on the surface of the carbon-containing hard mask layer; see, FIGS. 6-7 and FIG. 8D). In doing so, the at least one silicon-containing hard mask layer 818 reduces ion scattering during the dielectric etch process, which in turn, reduces or eliminates bowing of the HAR features etched within the underlying layer(s) 810. The at least one silicon-containing hard mask layer 818 is also harder to sputter into the profile. This reduces mask redeposition on sidewall surfaces of the HM stack 815 and necking of the HM stack, which reduces the imbalance of ions and neutrals flux to further improve the profile of the HAR features etched within the underlying layer(s) 810.

Because the hardness of the at least one silicon-containing hard mask layer 818 is higher than the carbon-containing hard mask layer 816, the etch resistance of the combined HM stack 815 is also improved during dielectric etching (compared to a dielectric etch process that only uses an ACL hard mask layer 115 to etch the underlying layer(s) 110, as shown in FIG. 1D). As noted above, the etch resistance of the at least one silicon-containing hard mask layer 818 may be approximately 30%-70% higher than the carbon-containing hard mask layer 816, depending on the hard mask materials and the etch recipe used to etch the one or more underlying layers 810. In some embodiments, the higher etch selectivity of the at least one silicon-containing hard mask layer 818 may be due, at least in part, to Si:C formation in the fluorocarbon plasma used during the dielectric etch process. In some embodiments, the higher etch selectivity of the at least one silicon-containing hard mask layer 818 may enable the overall thickness of the HM stack 815 to be reduced, thereby reducing the total aspect ratio and reducing the problems typically encountered in HAR etching.

Various embodiments of an improved etch process for etching features within a stacked structure, and more specifically, for etching high aspect ratio features within a one or more layers underlying a HM stack have been described above in reference to FIGS. 8A-8E. In some embodiments, the improved etch processes described herein may be particularly well suited for etching high aspect ratio features (e.g., features with aspect ratios ranging between 20-100 or more) within relatively thick (e.g., about 1 μm to 25 μm) dielectric layer(s), such as oxide, or a multilayer vertical stack of alternating conductive and dielectric layers, such as ONON or OPOP. In one example implementation, the improved etch processes described herein may be used to etch ~150 nm trench spaced ~1200 nm apart within a 4 μm-11 μm ONON layer. By including at least one silicon-containing hard mask layer 818 within the HM stack 815, the etch processes described herein improve the profile of the high aspect ratio features etched within the underlying layer(s) 810.

Figure 9:
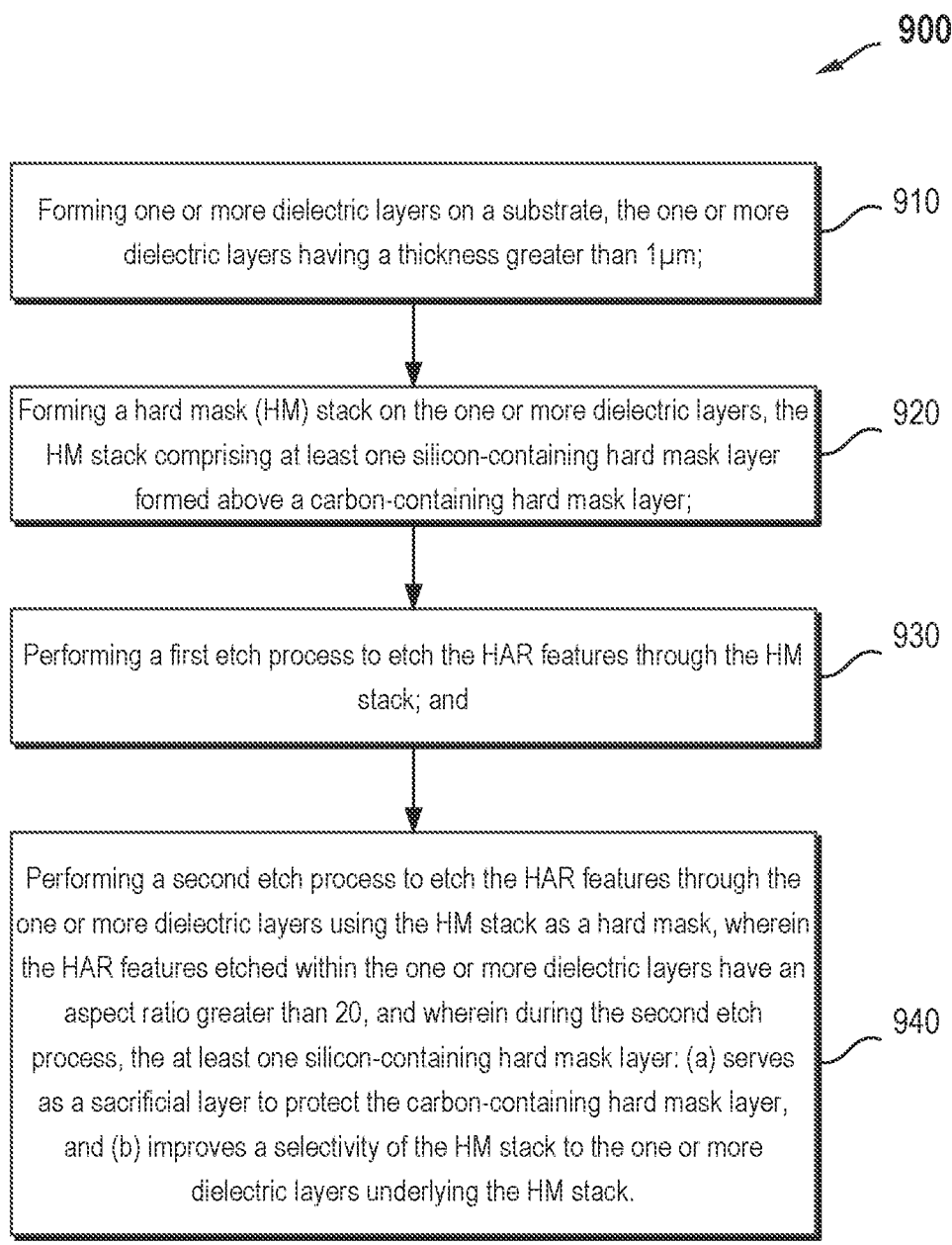
FIG. 9 is a flowchart diagram illustrating one embodiment of a method that utilizes the techniques described herein to improve the profile of high aspect ratio features etched within one or more dielectric layers of a stacked structure.

FIG. 9 is a flowchart diagram illustrating one embodiment of a method 900 that utilizes the techniques described herein to etch high aspect ratio (HAR) features within one or more dielectric layers. In some embodiments, the method 900 shown in FIG. 9 may include forming the one or more dielectric layers on a substrate, the one or more dielectric layers having a thickness greater than 1 μm (in step 910) and forming a hard mask (HM) stack on the one or more dielectric layers (in step 920). As noted above, the HM stack formed in step 920 may include at least one silicon-containing hard mask layer formed above a carbon-containing hard mask layer. The method 900 may further include performing a first etch process to etch the HAR features through the HM stack (in step 930) and performing a second etch process to etch the HAR features through the one or more dielectric layers using the HM stack as a hard mask (in step 940). In the method 900 shown in FIG. 9, the HAR features etched within the one or more dielectric layers have an aspect ratio greater than 20. During the second etch process performed in step 940, the at least one silicon-containing hard mask layer: (a) serves as a sacrificial layer to protect the carbon-containing hard mask layer, and (b) improves a selectivity of the HM stack to the one or more dielectric layers underlying the HM stack.

The method 900 shown in FIG. 9 may be used to improve the profile of HAR features etched within one or more dielectric layers underlying a HM stack comprising at least one silicon-containing hard mask layer formed above a carbon-containing hard mask layer. In some embodiments, a thickness of the at least one silicon-containing hard mask layer may range between 100 nm and 5 µm, a thickness of the carbon-containing hard mask layer may range between 1 µm and 4 µm, and a thickness of the one or more dielectric layers may range between 1 µm and 25 µm. In some embodiments, an aspect ratio of the high aspect ratio features etched within the one or more dielectric layers may range between 20 and 100 (or more).

In some embodiments, the carbon-containing hard mask layer may be formed above and in contact with the one or more dielectric layers underlying the HM stack. In one embodiment, the one or more dielectric layers may include at least one dielectric layer, and the carbon-containing hard mask layer may be formed above and in contact with the at least one dielectric layer. In another embodiment, the one or more dielectric layers may include a multilayer vertical stack of alternating layers of dielectric material and conductive material, and the carbon-containing hard mask layer may be formed above and in contact with a dielectric material layer of the multilayer vertical stack. In some embodiments, the carbon-containing hard mask layer may be an amorphous carbon layer (ACL) hard mask layer. Alternatively, the hard mask layer may include other carbon-containing hard mask layers (such as, e.g., an Advanced Patterning Film, APF, commercially available from Applied Materials) and other carbon-containing hard mask materials that exhibit good etch selectivity to dielectric.

In some embodiments, the at least one silicon-containing hard mask layer may include one or more of the following: an amorphous silicon hard mask layer, a polycrystalline silicon hard mask layer and a metal silicide hard mask layer. In some embodiments, the at least one silicon-containing hard mask layer may include an amorphous silicon hard mask layer or a polycrystalline silicon hard mask layer, and may further include a metal silicide hard mask layer. In some embodiments, the at least one silicon-containing hard mask layer may include a metal silicide hard mask layer selected from a group consisting of a tungsten silicide ($W_xSi_y$), a titanium silicide ($Ti_xSi_y$), a cobalt silicide ($Co_xSi_y$), a nickel silicide ($Ni_xSi_y$), an aluminum silicide ($Al_xSi_y$), a molybdenum silicide ($Mo_xSi_y$), a tantalum silicide ($Ta_xSi_y$) and a platinum silicide ($Pt_xSi_y$). In one example embodiment, the at least one silicon-containing hard mask layer may include a tungsten silicide hard mask layer having a thickness that ranges between 100 nm and 5 µm.

In some embodiments, the method 900 shown in FIG. 9 may further include forming an additional hard mask layer on the HM stack prior to performing the first etch process. In such embodiments, the additional hard mask layer may be used as a hard mask during the first etch process when etching the HAR features through the HM stack. The additional hard mask layer may comprise a wide variety of hard mask materials, including but not limited to, oxide, silicon nitride (SiN), silicon oxynitride (SiON), silicon oxide (SiO), doped SiO, titanium (Ti) and titanium nitride (TiN). In some embodiments, the method 900 shown in FIG. 9 may further include removing the additional hard mask layer during or after the first etch process. In other embodiments, at least a portion of the additional hard mask layer may remain on the HM stack at the beginning of the second etch process.

Figure 10:
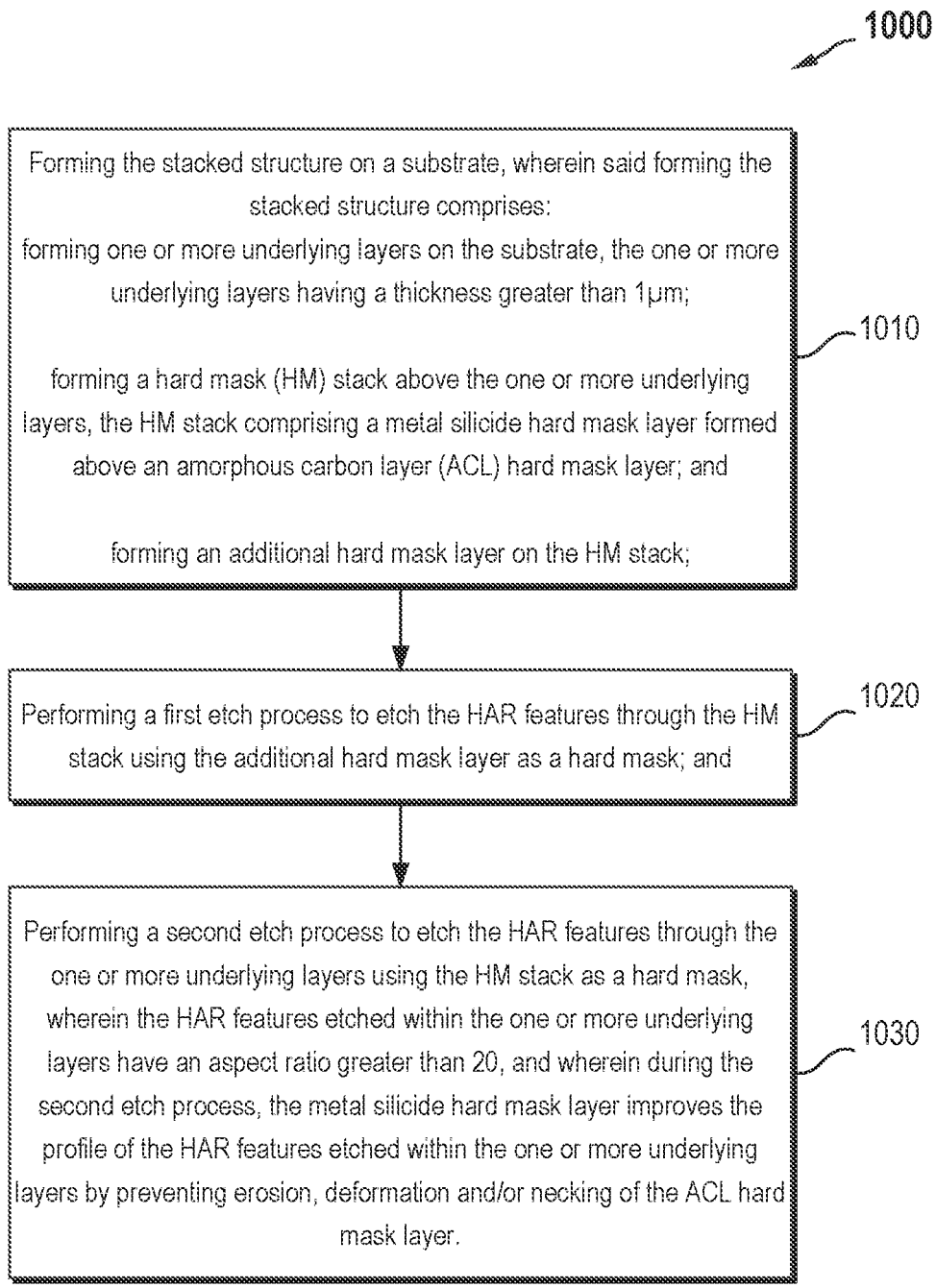
FIG. 10 is a flowchart diagram illustrating one embodiment of a method that utilizes the techniques described herein to improve the profile of high aspect ratio features etched within one or more underlying layers of a stacked structure.

FIG. 10 is a flowchart diagram illustrating one embodiment of a method 1000 that utilizes the techniques described herein to improve a profile of high aspect ratio (HAR) features etched a stacked structure. In some embodiments, the method 1000 shown in FIG. 10 may begin by forming a stacked structure on a substrate (in step 1010), wherein said forming the stacked structure includes: forming one or more underlying layers on the substrate, the one or more underlying layers having a thickness greater than 1 µm; forming a hard mask (HM) stack above the one or more underlying layers, the HM stack comprising a metal silicide hard mask layer formed above an amorphous carbon layer (ACL) hard mask layer; and forming an additional hard mask layer on the HM stack. The method 1000 may further include performing a first etch process to etch the HAR features through the HM stack using the additional hard mask layer as a hard mask (in step 1020) and performing a second etch process to etch the HAR features through the one or more underlying layers using the HM stack as a hard mask (in step 1030). In the method 1000 shown in FIG. 10, the HAR features etched within the one or more underlying layers have an aspect ratio greater than 20. During the second etch process performed in step 1030, the metal silicide hard mask layer improves the profile of the HAR features etched within the one or more underlying layers by preventing erosion, deformation and/or necking of the ACL hard mask layer.

The method 1000 shown in FIG. 10 may be used to improve the profile of HAR features etched within one or more layers underlying a HM stack comprising a metal silicide hard mask layer formed above an ACL hard mask layer. In some embodiments, a thickness of the metal silicide hard mask layer may range between 100 nm and 5 µm, a thickness of the ACL hard mask layer may range between 1 µm and 4 µm, and a thickness of the one or more underlying layers may range between 1 µm and 25 µm. In some embodiments, an aspect ratio of the high aspect ratio features etched within the one or more underlying layers may range between 20 and 100 (or more).

The one or more underlying layers may include a wide variety of materials. In one embodiment, the one or more underlying layers may include at least one dielectric layer, and the ACL hard mask layer may be formed above and in contact with the at least one dielectric layer. In another embodiment, the one or more underlying layers may include a multilayer vertical stack of alternating layers of dielectric material and conductive material, and the ACL hard mask layer may be formed above and in contact with a dielectric material layer of the multilayer vertical stack.

A wide variety of metal silicide materials may be used within the HM stack. For example, the metal silicide hard mask layer may be selected from a group consisting of a tungsten silicide ($W_xSi_y$), a titanium silicide ($Ti_xSi_y$), a cobalt silicide ($Co_xSi_y$), a nickel silicide ($Ni_xSi_y$), an aluminum silicide ($Al_xSi_y$), a molybdenum silicide ($Mo_xSi_y$), a tantalum silicide ($Ta_xSi_y$) and a platinum silicide ($Pt_xSi_y$), in some embodiments. In one example embodiment, the metal silicide hard mask layer may be a tungsten silicide hard mask layer having a thickness that ranges between 100 nm and 5 µm.

The first etch process and the second etch process may each utilize a variety of etch chemistries for etching the HAR features within the corresponding layers. In some embodiments, the first etch process performed in step 1020 may use an etch chemistry comprising sulfur-containing process gases, oxygen-containing process gases and chlorine-containing process gases to etch the HAR features through the HM stack. For example, the first etch process may utilize chlorine ($Cl_2$), oxygen ($O_2$) and argon (Ar) to etch the HAR features through the metal silicide hard mask layer, and sulfur dioxide ($SO_2$) and oxygen ($O_2$) process gases to etch the HAR features through the ACL hard mask layer.

In some embodiments, the second etch process performed in step 1030 may use a fluorocarbon etch chemistry to etch the HAR features through the one or more underlying layers. For example, process gases utilized within the second etch process may be selected from a group consisting of $C_4F_6$, $C_4F_8$, $C_3F_6$, $C_3F_8$, $CH_2F_2$, $CHF_3$, and $CF_4$. One or more of these fluorocarbon gases can be optionally combined with oxygen ($O_2$) and/or one or more dilution gases (e.g., krypton, argon, nitrogen, carbon monoxide, etc.) at a variety of pressure, power, flow and temperature conditions to etch the HAR features within the one or more underlying layers. In one example embodiment, a fluorocarbon, oxygen and krypton etch chemistry may be used to etch the HAR features through the one or more underlying layers in step 1030.

Figure 11:
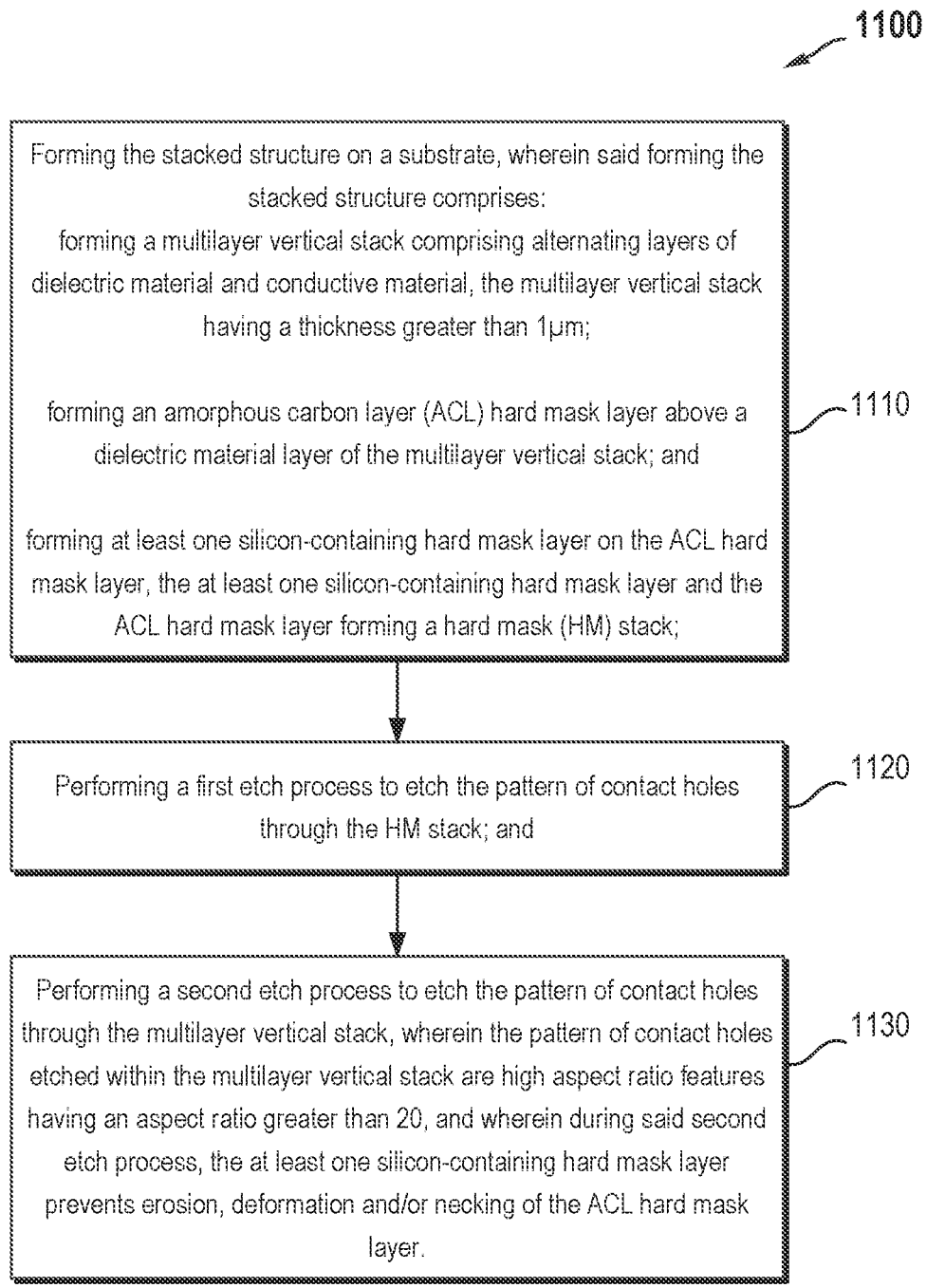
FIG. 11 is a flowchart diagram illustrating one embodiment of a method that utilizes the techniques described herein to improve the profile of high aspect ratio features etched within one or more dielectric layers of a stacked structure included within a three-dimensional (3D) stacked semiconductor memory.

FIG. 11 is a flowchart diagram illustrating an embodiment of a method 1100 that utilizes the techniques described herein to etch a pattern of contact holes within a stacked structure included within a three-dimensional (3D) stacked semiconductor memory, such as a 3D-NAND Flash memory device or the like. In some embodiments, the method 1100 shown in FIG. 11 may begin by forming the stacked structure on a substrate (in step 1110), wherein said forming the stacked structure includes: forming a multilayer vertical stack comprising alternating layers of dielectric material and conductive material, the multilayer vertical stack having a thickness greater than 1 µm; forming an amorphous carbon layer (ACL) hard mask layer above a dielectric material layer of the multilayer vertical stack; and forming at least one silicon-containing hard mask layer on the ACL hard mask layer, the at least one silicon-containing hard mask layer and the ACL hard mask layer forming a hard mask (HM) stack. The method 1100 may further include performing a first etch process to etch the pattern of contact holes through the HM stack (in step 1120) and performing a second etch process to etch the pattern of contact holes through the multilayer vertical stack (in step 1130), wherein the pattern of contact holes etched within the multilayer vertical stack are high aspect ratio features having an aspect ratio greater than 20. During said second etch process, the at least one silicon-containing hard mask layer prevents erosion, deformation and/or necking of the ACL hard mask layer.

The method 1100 shown in FIG. 11 may be used to improve the profile of contact holes etched within a multilayer vertical stack underlying a HM stack comprising at least one silicon-containing hard mask layer formed above an ACL hard mask layer. In some embodiments, a thickness of the at least one silicon-containing hard mask layer may range between 100 nm and 5 µm, a thickness of the ACL hard mask layer may range between 1 µm and 4 µm, and a thickness of the multilayer vertical stack may range between 1 µm and 25 µm. In some embodiments, an aspect ratio of the contact holes etched within the multilayer vertical stack may range between 20 and 100 (or more).

A wide variety of silicon-containing materials may be utilized within the HM stack. In some embodiments, the at least one silicon-containing hard mask layer may include a first silicon-containing hard mask layer and a second silicon-containing hard mask layer, which is different from the first silicon-containing hard mask layer. In some embodiments, the at least one silicon-containing hard mask layer may include one or more of the following: an amorphous silicon hard mask layer, a polycrystalline silicon hard mask layer and a metal silicide hard mask layer. In some embodiments, the at least one silicon-containing hard mask layer may include a metal silicide hard mask layer selected from a group consisting of a tungsten silicide ($W_xSi_y$), a titanium silicide ($Ti_xSi_y$), a cobalt silicide ($Co_xSi_y$), a nickel silicide ($Ni_xSi_y$), an aluminum silicide ($Al_xSi_y$), a molybdenum silicide ($Mo_xSi_y$), a tantalum silicide ($Ta_xSi_y$) and a platinum silicide ($Pt_xSi_y$). In one example embodiment, the at least one silicon-containing hard mask layer may include a tungsten silicide hard mask layer.

As noted above and shown in the drawings, various embodiments of stacked structures, process steps and methods for etching high aspect ratio features (e.g., contact holes, vias, trenches, etc.) are provided herein to reduce or eliminate problems, such as bowing, twisting, distortion and/or wiggling of etched HAR features, that occur during conventional etch processes. It is noted that the process steps and methods described herein may be utilized within a wide range of processing systems including plasma processing systems. For example, the process steps and methods may be utilized with plasma etch process systems, plasma deposition process systems, or any other plasma process system.

It is further noted that the deposition processes disclosed herein can be implemented using a wide variety of deposition processes, systems and techniques. For example, the deposition processes used to form the layers of the stacked structure described herein can be implemented using chemical vapor deposition (CVD), plasma enhanced CVD (PECVD), physical vapor deposition (PVD), atomic layer deposition (ALD), and/or other deposition processes. For a plasma deposition process, a gas mixture including one or more precursor gases in combination with one or more inert gases (e.g., argon, nitrogen, etc.) can be used at a variety of pressure, power, flow and temperature conditions. The precursor gas(es) used during the various plasma deposition processes may generally depend on the layer being deposited. Lithography processes with respect to photoresist layers can be implemented using optical lithography, extreme ultra-violet (EUV) lithography, and/or other lithography processes.

The etch processes disclosed herein can also be implemented using a wide variety of etch processes, systems and techniques, including plasma etch processes, discharge etch processes, and/or other desired etch processes. For example, plasma etch processes can be implemented using a plasma containing various processing gases (including reactive and inert gases). In addition, operating variables for process steps can be controlled to ensure that etch rate and critical dimension (CD) target parameters are achieved during via and contact hole formation. The operating variables being controlled may include, for example, the chamber temperature, chamber pressure, flow rates of gases, frequency and/or power applied to electrode assembly in the generation of plasma, and/or other operating variables for the processing steps. Variations can also be implemented while still taking advantage of the techniques described herein.

The techniques described herein for etching a plurality of high aspect ratio features (e.g., contact holes, vias, trenches, etc.) within one or more dielectric layers utilizing a HM stack as disclosed herein may be accomplished with a variety of etch process conditions (power, pressure, temperature, gasses, flow rates, etc.). An exemplary process recipe is described herein for use with an inductively coupled plasma (ICP) processing system and/or a capacitively coupled plasma (CCP) processing system; however other process tools, process conditions and variables may be utilized.

In one embodiment, an ICP and/or CCP plasma processing system may be used to etch the plurality of features 840 within the stacked structure 800 shown in FIGS. 8A-8E. As noted above, the stacked structure 800 may generally include a HM stack 815 formed above and in contact with one or more underlying layers 810. The HM stack 815 may include at least one silicon-containing hard mask layer 818 (such as, e.g., amorphous silicon, polysilicon, a metal silicide or another silicon-containing hard mask material) formed on top of a carbon-containing hard mask layer 816 (such as, e.g., ACL, APF or another carbon-containing hard mask material). The combined HM stack 815 may be deposited to a thickness ranging between approximately 1 µm to 5 µm (or more). The one or more underlying layers 810 may include one or more dielectric layers (such as an oxide) or a multilayer vertical stack of alternating dielectric and conductive layers (such as ONON or OPOP). The underlying layer(s) 810 may be deposited to a thickness ranging between 1 µm to 25 µm or more.

In some embodiments, a first etch process may be performed within the plasma processing system to etch the plurality of features 840 within the HM stack 815, as shown in FIG. 8C. The process parameters utilized in the first etch process (e.g., process gases, power, pressure, temperature, etc.) may vary depending on the hard mask materials included within the HM stack 815 and the material composition of the underlying layer(s) 810. As noted above, for example, the first etch process may utilize chlorine ($Cl_2$), oxygen ($O_2$) and argon (Ar) to etch the plurality of features 840 through the at least one silicon-containing hard mask layer 818, and sulfur dioxide ($SO_2$) and oxygen ($O_2$) process gases to etch the plurality of features 840 through the carbon-containing hard mask layer 816. In some embodiments, the first etch process may be performed within an ICP processing system. In other embodiments, a CCP processing system may be utilized.

When etching the plurality of features 840 within the at least one silicon-containing hard mask layer 818, for example, the first etch process may utilize a source power (high frequency) in a range of 0-1500 W, a bias power (low frequency) in a range of 0-1900 W, a pressure in a range of 5-700 mTorr, and a temperature in a range of 0-90 degrees Celsius. Gasses utilized in the first etch process may include chlorine-containing gases (such as $C_{l2}$) in a range of 8-804 standard cubic centimeters per minute (sccm), oxygen-containing gases (such as $O_2$) in the range of 13-1250 sccm, optionally in combination with one or more dilution gases, such as argon (Ar) in the range of 12-1150_sccm. Optional process gases that may be used to etch the at least one silicon-containing hard mask layer 818 include, but are not limited to, hydrogen bromide (HBr) in the range of 8-759 sccm.

When etching the plurality of features 840 within the carbon-containing hard mask layer 816 (e.g., an ACL hard mask layer), the first etch process may utilize a source power (high frequency) in a range of 0-1500 W, a bias power (low frequency) in a range of 0-1900 W, a pressure in a range of 5-700 mTorr, and a temperature in a range of 0-90 degrees Celsius. Gasses utilized in the first etch process may include sulfur-containing gases (such as $SO_2$) in a range of 8-480 sccm and oxygen-containing gases (such as $O_2$) in the range of 13-1250 sccm. Optional process gases that may be used to etch the carbon-containing hard mask layer 816 include, but are not limited to, boron trichloride ($BCl_3$) in the range of 6-177 sccm, helium (He) in the range of 24-2387 sccm, and silicon tetrachloride ($SiCl_4$) in the range of 5-22 sccm.

After the HM stack 815 is opened, a second etch process may be performed within the plasma processing system to etch the plurality of features 840 within the one or more underlying layers 810, as shown in FIG. 8D. As noted above, the second etch process may utilize various fluorocarbon (CxFy) process gases in combination with oxygen ($O_2$) and/or one or more dilution gases (e.g., krypton, argon, nitrogen, etc.) to etch the plurality of features 840 within the one or more underlying layers 810. The process parameters utilized in the second etch process (e.g., process gases, power, pressure, temperature, etc.) may vary depending on the hard mask materials included within the HM stack 815 and the material composition of the underlying layer(s) 810. In some embodiments, the second etch process may be performed within an CCP processing system. In other embodiments, a ICP processing system may be utilized.

For example, the second etch process may have a source power (high frequency) in a range of 500 W-7 kW, a bias power (low frequency) in a range of 0-32 kW, a pressure in a range of 7-800 mTorr, and a temperature in a range of 10-80 degrees Celsius. Gasses utilized in the second etch process step may include fluorocarbon-containing gases (such as, e.g., $C_4F_6$ in the range of 0-412 sccm, $C_4F_8$ in the range of 0-352 sccm, $CH_2F_2$ in the range of 0-187 sccm, $CHF_3$ in the range of 0-313 sccm), optionally in combination with oxygen-containing gases (such as $O_2$) in the range of 90-935 sccm and/or one or more dilution gases, such as krypton (Kr) in the range of 0-306 sccm and/or argon (Ar) in the range of 0-1420 sccm. Optional process gases that may be used to etch the one or more underlying layers 810 include, but are not limited to, other fluorocarbon-containing gases (such as, e.g., $C_3F_8$ in the range of 0-222 sccm and $CF_4$ in the range of 0-336 sccm), carbon monoxide (CO) in the range of 0-1000 sccm and nitrogen ($N_2$) in the range of 0-500 sccm.

Stacked structures, process steps and methods for etching high aspect ratio features within one or more layers underlying a hard mask stack are described herein in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate including a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Further modifications and alternative embodiments of the described stacked structures, process steps and methods will be apparent to those skilled in the art in view of this description. It will be recognized, therefore, that the described systems and methods are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for etching high aspect ratio (HAR) features within one or more dielectric layers, the method comprising:
    forming the one or more dielectric layers on a substrate, the one or more dielectric layers having a thickness greater than 1 µm;
    forming a hard mask (HM) stack on the one or more dielectric layers, the HM stack comprising at least one silicon-containing hard mask layer formed above a carbon-containing hard mask layer;
    performing a first etch process to etch the HAR features through the HM stack; and
    performing a second etch process to etch the HAR features through the one or more dielectric layers using the HM stack as a hard mask, wherein the HAR features etched within the one or more dielectric layers have an aspect ratio greater than 20, and wherein during the second etch process, the at least one silicon-containing hard mask layer: (a) serves as a sacrificial layer to protect the carbon-containing hard mask layer, and (b) improves a selectivity of the HM stack to the one or more dielectric layers underlying the HM stack.

2. The method of claim 1, wherein the carbon-containing hard mask layer comprises an amorphous carbon layer (ACL) hard mask layer or an Advanced Patterning Film (APF) hard mask layer.

3. The method of claim 1, wherein the at least one silicon-containing hard mask layer comprises one or more of the following: an amorphous silicon hard mask layer, a polycrystalline silicon hard mask layer and or a metal silicide hard mask layer.

4. The method of claim 1, wherein the at least one silicon-containing hard mask layer comprises an amorphous silicon hard mask layer or a polycrystalline silicon hard mask layer, and further comprises a metal silicide hard mask layer.

5. The method of claim 1, wherein the at least one silicon-containing hard mask layer comprises a metal silicide hard mask layer comprising a tungsten silicide ($W_xSi_y$), a titanium silicide ($Ti_xSi_y$), a cobalt silicide ($Co_xSi_y$), a nickel silicide ($Ni_xSi_y$), an aluminum silicide ($Al_xSi_y$), a molybdenum silicide ($Mo_xSi_y$), a tantalum silicide ($Ta_xSi_y$) or a platinum silicide ($Pt_xSi_y$).

6. The method of claim 1, wherein the at least one silicon-containing hard mask layer comprises a tungsten silicide hard mask layer, and wherein a thickness of the tungsten silicide hard mask layer ranges between 100 nm and 5 µm.

7. The method of claim 1, further comprising forming an additional hard mask layer on the HM stack prior to performing the first etch process, wherein said performing the first etch process uses the additional hard mask layer as a hard mask when etching the HAR features through the HM stack.

8. The method of claim 7, wherein the additional hard mask layer comprises oxide, silicon nitride (SiN), silicon oxynitride (SiON), silicon oxide (SiO), doped SiO, titanium (Ti) or titanium nitride (TiN).

9. The method of claim 7, further comprising removing the additional hard mask layer during or after the first etch process.

10. The method of claim 7, wherein at least a portion of the additional hard mask layer remains on the HM stack at the beginning of the second etch process.

11. The method of claim 1, wherein the method is a method for improving a profile of the HAR features, wherein the HAR features are etched within a stacked structure, and wherein the method of claim 1 further comprises:
    forming the stacked structure on a substrate, wherein said forming the stacked structure comprises:
        forming one or more underlying layers on the substrate, wherein the one or more underlying layers comprise the one or more dielectric layers;
        forming the HM stack above the one or more underlying layers, wherein the at least one silicon-containing hard mask layer included within the HM stack is a metal silicide hard mask layer, and wherein the carbon-containing hard mask layer included within the HM stack is an amorphous carbon layer (ACL) hard mask layer; and
        forming an additional hard mask layer on the HM stack;
    wherein, the performing the first etch process to etch the HAR features through the HM stack further comprises using the additional hard mask layer as an additional hard mask; and
    wherein during the second etch process, the metal silicide hard mask layer improves the profile of the HAR features etched within the one or more underlying layers by preventing erosion, deformation and/or necking of the ACL hard mask layer.

12. The method of claim 11, wherein a thickness of the metal silicide hard mask layer ranges between 100 nm and 5 µm, wherein a thickness of the ACL hard mask layer ranges between 1 µm and 4 µm, and wherein the thickness of the one or more underlying layers ranges between 1 µm and 25 µm.

13. The method of claim 11, wherein the metal silicide hard mask layer comprises a tungsten silicide ($W_xSi_y$), a titanium silicide ($Ti_xSi_y$), a cobalt silicide ($Co_xSi_y$), a nickel silicide ($Ni_xSi_y$), an aluminum silicide ($Al_xSi_y$), a molybdenum silicide ($Mo_xSi_y$), a tantalum silicide ($Ta_xSi_y$) or a platinum silicide ($Pt_xSi_y$).

14. The method of claim 11, wherein the one or more underlying layers comprise a dielectric material, and wherein the ACL hard mask layer is formed above and in contact with the dielectric material.

15. The method of claim 11, wherein the one or more underlying layers comprise a multilayer vertical stack of alternating layers of dielectric material and conductive material, and wherein the ACL hard mask layer is formed above and in contact with a dielectric material layer of the multilayer vertical stack.

16. The method of claim 11, wherein first etch process uses etch chemistries comprising sulfur-containing processes gases and chlorine-containing process gases to etch the HAR features through the HM stack.

17. The method of claim 11, wherein second etch process uses a fluorocarbon etch chemistry to etch the HAR features through the one or more underlying layers.

18. The method of claim 1, wherein the method is a method for etching a pattern of contact holes within a stacked structure included within a three-dimensional (3D) stacked semiconductor memory, and wherein the method of claim 1 further comprises:

forming the stacked structure on a substrate, wherein said forming the stacked structure comprises:

forming a multilayer vertical stack wherein the multilayer vertical stack comprises the one or more dielectric layers, wherein the multilayer vertical stack comprises alternating layers of dielectric material and conductive material;

forming the HM stack above the one or more dielectric layers, wherein the carbon-containing hard mask layer is an amorphous carbon layer (ACL) hard mask layer; and wherein the performing the first etch process to etch the HAR features through the HM stack etches the pattern of contact holes through the HM stack; and wherein during said second etch process, the at least one silicon-containing hard mask layer prevents erosion, deformation and/or necking of the ACL hard mask layer.

19. The method of claim 18, wherein a thickness of the at least one silicon-containing hard mask layer ranges between 100 nm and 5 µm, wherein a thickness of the ACL hard mask layer ranges between 1 µm and 4 µm, and wherein the thickness of the multilayer vertical stack ranges between 1 µm and 25 µm.

20. The method of claim 18, wherein the at least one silicon-containing hard mask layer comprises a first silicon-containing hard mask layer and a second silicon-containing hard mask layer, which is different from the first silicon-containing hard mask layer.

21. The method of claim 18, wherein the at least one silicon-containing hard mask layer comprises one or more of the following: an amorphous silicon hard mask layer, a polycrystalline silicon hard mask layer or a metal silicide hard mask layer.

22. The method of claim 18, wherein the at least one silicon-containing hard mask layer comprises a metal silicide hard mask layer comprising a tungsten silicide ($W_xSi_y$), a titanium silicide ($Ti_xSi_y$), a cobalt silicide ($Co_xSi_y$), a nickel silicide ($Ni_xSi_y$), an aluminum silicide ($Al_xSi_y$), a molybdenum silicide ($Mo_xSi_y$), a tantalum silicide ($Ta_xSi_y$) or a platinum silicide ($Pt_xSi_y$).

* * * * *